United States Patent [19]

Yoshinaka et al.

[11] Patent Number: 5,158,643
[45] Date of Patent: Oct. 27, 1992

[54] METHOD FOR MANUFACTURING ZINC OXIDE WHISKERS

[75] Inventors: Minoru Yoshinaka, Higashiosaka; Eizo Asakura, Suita; Motoi Kitano, Kawanishi; Jun Yagi, Hirakata; Hideyuki Yoshida, Amagasaki; Takashige Sato, Takatsuki, all of Japan

[73] Assignee: Matsushita Electric Industrial Co., Ltd., Osaka, Japan

[21] Appl. No.: 566,475
[22] PCT Filed: Dec. 12, 1989
[86] PCT No.: PCT/JP89/01246
  § 371 Date: Feb. 26, 1991
  § 102(e) Date: Feb. 26, 1991
[87] PCT Pub. No.: WO90/07022
  PCT Pub. Date: Jun. 28, 1990

[30] Foreign Application Priority Data

| Dec. 16, 1988 | [JP] | Japan | 63-319020 |
| Dec. 16, 1988 | [JP] | Japan | 63-319021 |
| Dec. 20, 1988 | [JP] | Japan | 63-321177 |
| Dec. 22, 1988 | [JP] | Japan | 63-324076 |
| Dec. 22, 1988 | [JP] | Japan | 63-324077 |
| Dec. 26, 1988 | [JP] | Japan | 63-328271 |
| Dec. 27, 1988 | [JP] | Japan | 63-332869 |
| Dec. 27, 1988 | [JP] | Japan | 63-332870 |

[51] Int. Cl.$^5$ ............................................. C30B 29/60
[52] U.S. Cl. ........................ 156/603; 156/DIG. 112; 429/216; 423/229
[58] Field of Search ............... 156/603, DIG. 112; 429/216; 423/229

[56] References Cited

U.S. PATENT DOCUMENTS

| 3,844,838 | 10/1974 | Louzos | 429/229 |
| 3,853,625 | 12/1974 | Louzos | 429/229 |
| 4,487,651 | 12/1984 | Wang | 156/DIG. 83 |
| 4,722,763 | 2/1988 | Pa et al. | 156/616.1 |

OTHER PUBLICATIONS

*Zinc Oxide Whiskers;* Chiku et al.; Toyota Central Research and Development Laboratories, Inc. (1973) (1975).

*Primary Examiner*—Robert Kunemund
*Assistant Examiner*—Felisa Garrett
*Attorney, Agent, or Firm*—Wenderoth, Lind & Ponack

[57] ABSTRACT

The present invention provides a method for manufacturing zinc oxide whiskers, whereby zinc powders composed of particles coated with an oxide film, preferably an oxide film having a superior sealing property are, heated for oxidization in an atmosphere containing oxygen.

The atmosphere may contain carbon dioxide or steam.

The obtained zinc oxide whiskers are formed in a single crystal comprised of a core part and an acicular part spreading in four different directions from the core part.

For a baking furnace to obtain zinc oxide whiskers, is employed one that successively forms an atmosphere of a high partial pressure of zinc steam at the source side and an atmosphere of a high partial pressure of oxygen for facilitating formation of whiskers. The zinc oxide whiskers can be controlled in size by selecting the relative ratio of the partial pressure of zinc steam and oxygen.

Accordingly, zinc oxide whiskers obtained by the present invention are formed in a single crystal without anisotropy, thereby being applicable to a variety of constructional or electronic materials with no anisotropy in strength and electric properties. Because the resultant crystal is several hundreds μm, the zinc oxide whiskers may be mixed with metals, ceramics or synthetic resins, etc. to increase the mechanical strength thereof remarkably.

21 Claims, 16 Drawing Sheets

100μm

100μm

100μm

100 μm

100 μm

100 μm

100μm

100μm

100μm

100 μm

100 μm

100 μm

100 μm

10 μm

100 μm

100μm

80 μm

20μm

20μm

30μm

100μm

10μm

10μm

100 μm

100 μm

20μm

100μm

100μm

100 μm

20 μm

METHOD FOR MANUFACTURING ZINC OXIDE WHISKERS

BACKGROUND OF THE INVENTION

The present invention generally relates to a method for manufacturing zinc oxide whiskers, and more particularly, to a method for manufacturing zinc oxide whiskers in uniform shape wherein each whisker is formed in a crystalline body composed of a core part and an acicular part extending not smaller than several tm long in four different directions from said core part (this structure of a whisker is hereinafter referred to as a specific shape).

At present, zinc oxide generally used as an industrial material is manufactured by a so-called French method in many cases. According to this French method, zinc oxide results in a dumpling aggregate of particles not uniform in size and particularly in shape. Although another method is known to produce zinc oxide in particles of slender and short aciculae with high yield (for example, disclosed in Japanese Patent Publication No. 60-5529 (5529/1985), this method is a revised version of the above French method, whereby steam of heated zinc is led outside a furnace and cooled rapidly, without achieving a huge crystalline body, but forming an acicular crystal of a very small size (0.1-15 tm long).

The acicular crystals obtained in the above-described prior arts are smaller in size by approximately two digits than various types of industrial whiskers presently in the market. Therefore, the prior art acicular crystals show no particular difference from the dumpling zinc oxide in terms of reinforcing effect for metals, ceramics, resins or the like. An outstanding reinforcing effect of whisker is not found in the prior art acicular particles. Meanwhile, a whisker consisting of a single crystal in fibrous structure has a remarkably high mechanical strength as compared with the dumpling substance of the same material, and accordingly drawing attention as a reinforcing material to obtain great mechanical strength in mixture with the other substance, and nowadays, various kinds of whiskers composed of, for example, metal, metal oxide, metal carbide, metal nitride, etc. are sold for industrial use. Moreover, although a whisker of zinc oxide having the length in mm digit is also known (Japanese Patent Laid-open Publication No. 50-5597 (5597/1975) which is the size of a simple acicula, the whisker disclosed in this prior art is manufactured from an alloy of zinc, and therefore impurities are included in the crystal, or a substrate is indispensable during the growth of the crystal at a position far from the material, with the other inconveniences being noted in the manufacture. That is, a complicated structure of the device for the manufacture, a long-time operation with low yield, etc. still remain to be solved. In other words, most of the prior art whiskers are within the range of experimental studies.

SUMMARY OF THE INVENTION

An object of the present invention is to provide a method for manufacturing an aggregate of huge crystalline zinc oxide whiskers of the size suitable or larger for industrial use.

A further object of the present invention is to provide a method for manufacturing zinc oxide whiskers in a specific shape of the size necessary for industrial use, whereby 3-30 μm zinc oxide whiskers and 30-250 μm zinc oxide whiskers are selectively manufactured with high yield in a short time.

A still further object of the present invention is to provide a novel and simple method for manufacturing zinc oxide whiskers in a specific shape of the size necessary for industrial use with a small variation in distribution of the size, and more specifically, a novel manufacturing method of whiskers related to a baking process for evaporating metallic zinc, forming a core of crystal and growing the crystal.

A method for manufacturing zinc oxide whiskers according to one aspect of the present invention is characterized in that zinc powders coated with an oxide film on the surface thereof are heated in an atmosphere containing oxygen thereby to produce zinc oxide. It is a characteristic practice in the prior art vapor-phase manufacturing method like the improved French method or the method of a simple acicular crystal mentioned above that the position where the material is placed is separated from the position where the whiskers are generated and grown. On the contrary, according to the present invention, whiskers are formed in the same place as where the material is placed. The present invention employs a container having one surface opposite to the bottom surface opened. The container accommodating zinc powders is placed in a preheated furnace, heated and oxidized in an atmosphere containing oxygen, whereby an aggregate of huge zinc oxide whiskers in a specific shape which is completely different from the prior art can be obtained. Moreover, the whiskers are piled up in the upper part in the container, with a by-product, namely, a layer of zinc oxide in a dumpling state piled in the lower part in the container separately from the layer of whiskers.

It is desirable to scatter the zinc powders in layers on the bottom surface of the container, which may be done after the container is preheated in the furnace.

In the majority of the present invention, an oxide film is essential to zinc powders, which is formed in many cases when powders of zinc are prepared. In the case where the oxide film is achieved through molten powders of zinc, the film becomes partly porous and easy to be thick. On the other hand, when solid zinc is pulverized to obtain the oxide film, the film tends to be fine and thin.

For coating zinc powders with the oxide film or increasing the film thickness of the oxide film, it is preferable to grind the zinc powders in coexistence with water to mature.

According to one manufacturing method of the present invention, zinc powders coated with a sealing oxide film are heated in an atmosphere containing oxygen, thereby to produce zinc oxide.

The sealing oxide film referred to above is a film which can restrict generation of zinc steam from inside. Such oxide film with sealing property is, as will be described later, preferably formed when zinc powders are prepared. Oxidization of zinc powders is effected after the zinc powders are melted in hot water or through vaporization or evaporation by condensation, or mechanically pulverized in solid state. If the oxide film obtained in the above manner is not satisfactory in terms of the sealing property, the zinc powders should be ground with water to mature, so that the sealing property is more improved.

One method for manufacturing zinc oxide whiskers according to the present invention is further characterized in that metallic zinc powders are added with ceramic powders, and heated in an atmosphere containing oxygen, thereby to form zinc oxide.

In this case, it is desirable that metallic zinc powders are preliminarily added and mixed with ceramic powders of some kind or other and then heated under the above-mentioned conditions.

According to one manufacturing method of zinc oxide whiskers of the present invention, zinc powders are obtained through gas flame-spray or plasma spray, which are in turn heated in an atmosphere containing oxygen, thereby to form zinc oxide.

The zinc powders obtained through flame-spray of zinc metal are struck out into the air as dissolved particles and coated with the oxide film on the surface thereof. The particles may be ground and matured with water so as to improve more the shape and size of the resultant whiskers, a will be discussed later.

A metallic crucible employed in the present invention has a side face 10 made of non-porous material, or expanded metal, wire mesh or panting metal having a high numerical aperture not smaller than 20% as indicated in FIG. 26. A bottom face of the crucible is formed of material having a low numerical aperture 0-3%, i.e., porcelain or corrosion-resistive stainless steel plate not containing nickel, which is used as a saucer 11 to place zinc powders coated with the oxide film. When zinc powders with the oxide film are put on the saucer 11 in the high numerical aperture crucible 12 into a muffle furnace 13 shown in FIG. 27, while a constant amount of the air is being introduced into the furnace from outside, the zinc powders are heated thereby to form zinc oxide whiskers of a huge crystal.

The stainless steel not containing nickel as mentioned above is preferably composed of chromium by 18-20%, aluminum 2-3% and iron by the remaining amount.

As shown in FIG. 30, in one method of the present invention, a crucible 13 has the side face 10 made of expanded metal, wire mesh or panting metal having a high numerical aperture equal to or larger than 20%, and the bottom face made of porcelain or corrosion-resistive stainless steel plate having a low numerical aperture 0-3%. The less steel plate bottom face serves as the saucer 11 to place the zinc powders with the oxide film thereon. Moreover, according to this method, a partition plate 12 is provided separated at least 15 mm or more above the bottom face and at a height not larger than the side surface The partition plate and standing wall members are made of the same high numerical aperture material. Zinc powders coated with the oxide film placed on the saucer 11 of the crucible 13 is put in a muffle furnace 14 of FIG. 32. While a constant amount of the air is being supplied into the furnace from outside, the zinc powders are heated, whereby zinc oxide whiskers of 30-250 tm huge crystals are generated on the bottom face below the partition plate, with zinc oxide whiskers of 3-30 tm crystals being formed above the partition plate.

In the manufacturing method above, the numerical aperture of the partition plate 12 is enough to be 20% or more, and it is not necessarily agreed with that of the side surface.

Moreover, the stainless steel not containing nickel mentioned above is preferably composed of chromium by 18-20%, aluminum by 2-3% and iron by the rest.

According to a method of the present invention, zinc powders which are substantially the material for zinc oxide whiskers are heated and oxidized in an atmosphere containing oxygen, thereby to produce zinc oxide whiskers in the atmosphere or on a substrate. The structure of the baking furnace and baking conditions are arranged so that the evaporation of zinc powders by heat, formation of a core of crystal for obtaining an oxide crystal, and growth of he crystal into a specific shape are all proceeded in the same field. The zinc powders employed here may be pure zinc which is partially oxidized or already coated with the oxide film. Or, the zinc powders may be mixed with the other metal than zinc or non-metal by the amount not so much as cannot be regarded as impurities.

The present invention is characterized in the conditions for the atmosphere so that zinc steam generated by heat can be instantaneously oxidized by the oxygen contained in the atmosphere, and at the same time, zinc steam can be continuously generated to supply zinc atoms enough for generated crystals to grow into a specific shape. These conditions are found out from repeated experiments in connection with the structure of the baking furnace. Concretely, one condition is to use a porous material for a wall member of the baking furnace, and another is to control in a predetermined range both the generating amount of zinc steam and the oxygen amount in the atmosphere satisfactorily to form crystals in a specific shape.

Furthermore, in one method for manufacturing zinc oxide whiskers according to the present invention, zinc powders are heated and oxidized in an atmosphere containing not only oxygen, but at least either carbon dioxide or steam, so that zinc oxide whiskers are generated in the atmosphere or on the substrate.

Each zinc oxide whisker obtained in the above-described method consists of a core part at the center and an acicular part extending in four different directions from the core part substantially with the same angles. The diameter at a base of the acicular part is 0.7-14 tm and the length from the base to a front end thereof is 3-200 tm. Although crystals extending in three or two directions are more or less mixed in the obtained whiskers, this occurs as a result of the fact that some complete whiskers are brought into touch with the other whiskers during the growth or thereafter, and consequently partly broken or stop growing. Because of the contact during the growth, some crystals in perfect specific shape may be adhered with crystals in other shape, i.e., plate-like form. However, the manufacturing method of the present invention mainly provides crystals in a specific shape.

In order to achieve an aggregate of whiskers in a specific huge shape with slim, short acicular crystals and without a secondary part as in the prior art, the inventors of the present invention have tried and studied various kinds of experiments, and as a result of the experiments it was confirmed that the using material and its manufacturing method play an important factor for successful whiskers.

More specifically, it was made clear that it was impossible to realize whiskers of a huge specific shape by selecting conditions of the baking atmosphere only, namely, the amount of zinc steam and oxygen amount when zinc metal was melted in hot water from an ingot or pure metallic zinc from reduced zinc or zinc compound, etc. was used. It was found essential to use zinc metal powders, particularly zinc powders coated with an oxide film on the surface thereof (a sealing oxide film is better). By heating and oxidizing the zinc powders in the container mentioned earlier, whiskers are formed in the upper part of the container and zinc oxide powders are accumulated in a dumpling state below the upper whiskers, and moreover a novel aggregate of zinc oxide whiskers is generated in a huge specific shape. The existing state and reacting state of the final product are common in every feature of the present invention as will be described later.

Further, according to one aspect of the present invention, the oxide film on the surface of zinc metal powders represents a sealing property against the zinc steam and smoke from inside the zinc metal. In other words, zinc powders coated with the oxide film of a higher sealing property are restricted more from generating steam and smoke at a low temperature region in comparison with zinc powders coated with the oxide film of a lower sealing property, whereas instantaneously generating zinc smoke and steam of high concentration at a high temperature region, followed by the oxidization reaction to produce zinc oxide whiskers. The oxide film (although zinc is melted, it is coated with the oxide film) has another effect to generate zinc smoke and steam of high concentration without causing mutual fusion or melting among the zinc metal.

In other words, the oxide film is effective to control the generation of zinc smoke and steam from inside. In addition, the zinc oxide part of the oxide film serves as a substrate during the growth of whiskers. The sealing property mentioned above is an ability to seal the steam from the zinc metal inside the powders at the surface thereof, which property is varied depending on the thickness and structure of the oxide film, and volume ratio between the zinc metal and zinc oxide, etc.

Particularly, the thickness and structure of the oxide film are determined at the manufacture of metallic powders. Namely, so long as zinc powders are prepared from molten zinc without a special control, the oxide film results in a thick and relatively porous film. On the other hand, when zinc powders are pulverized in the solid state, the film thickness becomes relatively small and the oxide film represents considerable fineness. Although the former oxide film shows better uniformity in film thickness, the latter is often not uniform in film thickness because of the relatively complicated irregular shape of powders. In the former case, if the film grows too thick, the surface of the film may become too fragile to crack. Therefore, granular powders having the oxide film of the kind described above are prone to cause cracks on the oxide film due to transition or some other reason.

Accordingly, grinding and maturing treatment is necessitated to solve the deterioration of the sealing property due to cracks on the oxide film or to increase the film thickness. This treatment allows the defective part of the oxide film to be selectively piled with the oxide thereon.

Zinc powders will be described more in detail hereinbelow.

Zinc powders having 0.1-500 tm particle size, particularly 10-300 tm particle size, may be employed and obtained through gas flame-spray, electric (arc) spray, plasma jet or the like of zinc wire, zinc rod or zinc powders, or by melting in hot water, i.e., granulation or atomizing process. The powders may be roughly crushed mechanically, that is, cut out from an ingot of ground metal or the like and crushed by a jaw crusher or gyratory crusher, and further disintegrated by a stamp mill or scroll mill, etc. The zinc powders are still more pulverized by a hammer mill, cutting mill, micronizer, or the like. Or, zinc powders may be formed through electrolysis, physical operation utilizing evaporation, solidification, etc., or chemical operation using chemical reaction. For general use, zinc powders are manufactured so that no oxide film is formed on the surface thereof. On the contrary, it is more effective according to the present invention if the zinc powders are coated with an oxide film and therefore, zinc powders can be manufactured in coexistence with water or with high concentration of oxygen (like in the atmospheric air) and high humidity, that is, in an atmosphere to facilitate oxidization. Good zinc powders may be obtained also at high a temperature under a high mechanical pressure. If the oxide film on the zinc powders obtained in any of the foregoing manners is insufficient in the sealing property, it can correct as follows.

Namely, zinc powders are first mechanically processed in a mortar grinder, roll, etc. in coexistence with water, and applied with pressure. Then, the zinc powders are left in water for 24 hours or longer. If the zinc powders are left for 76 hours, a perfect result can be gained. It is preferable to leave and mature the powders at 20° C. or higher. Although it is possible to form the oxide film not by mechano-chemical reaction, but by chemical reaction only, such as maturing, the chemical reaction generally takes too much time, whereas the mechano-chemical reaction is more effective to improve the sealing property.

Accordingly, the formation, increase and growth of the oxide film are dependent on (1) addition of mechanical pressure, (2) oxidization reaction in water or in high humidity, (3) multiplied effect of (1) and (2) (mechano-chemical reaction), (4) oxygen concentration and (5) temperature, etc. The time for (3) is greatly influential on the size of whiskers, especially the length and diameter of the acicular part. In other words, the multiplied effect of (3) can realize a good result in a short time.

If the zinc powders are ground and matured for a longer time in coexistence with water, the size of whiskers tends to be increased consequent to the improved sealing property of the oxide film.

The oxide film formed on the zinc powders can restrict the discharge of zinc from the metallic zinc inside at a low temperature region, and also restrict the movement of oxygen thereinto, because of the improvement of sealing property. Accordingly, sufficient concentration of zinc steam and smoke for the growth of single crystals are secured. The size of the crystals is remarkably increased as compared with that of the crystal formed through conventional vapor-phase method.

After the zinc powders are matured, they are dried. It is enough to remove moisture from the surface of the powders so much as to avoid an initial influence when the powders are moved into a high temperature region for baking, i.e., to prevent cracking of a crucible or scattering of powders. Therefore, the powders can be dried by air in a temperature range where the zinc powders are not melted.

The zinc powders after being dried are then scattered at the bottom of a heat-proof container for baking and oxidization. The above container is made of metal, carbon, porcelain (alumina) or the like material, with an opening face formed confronting to the bottom.

The container includes such one that is formed of a non-porous fine material or porous material. Specifically, the container may be a crucible. Thereafter, the container with powders is put in a furnace keeping an atmosphere containing preheated oxygen. The furnace is maintained at 700°–1300° C., particularly, 900°–1100° C. to obtain good whiskers from particles of any size.

It may also bring about a good result if prepared powders are scattered and baked in the crucible which has been kept in advance in the furnace in the above temperature range. The baking time is suitable to be 120-10 minutes in the temperature region 700°–1300° C., or 90-10 minutes in the temperature range 900°–1100° C. Baking and heating may be carried out generally in the air, but preferably with the use of a gas containing properly-mixed nitrogen and oxygen or an oxygen gas.

While the zinc powders repeat jumps and falls between the bottom and opening of the container especially at an early stage of heating, oxidization and growth of whiskers are promoted. Accordingly, an aggregate of whiskers of the present invention is piled in the upper part of the container, with zinc oxide powders being accumulated in a dumpling state in the lower part.

In accomplishing the manufacturing method of the present invention, zinc powders provided with the sealing oxide film are vital, and the perfect oxide film can be achieved in various kinds of manufacturing methods of powders through control of manufacturing conditions thereof, and moreover by grinding and maturing treatment in coexistence with water.

The above fact was confirmed through X-ray diffraction or observation by an electron microscope. The oxide film and the above grinding and maturing treatment add a special effect to the baking process.

Immediately after the zinc powders are manufactured in a favorable manner without being oxidized and accordingly without an oxide film formed, or if the zinc powders have an oxide film formed too thin and fragile to be observed by the X-ray diffraction, the powders do not jump and fall uniformly at baking, thereby causing uneven baking conditions. In this case, therefore, even if the temperature and oxygen concentration are adjusted, zinc oxide in a dumpling state of various colors and metallic zinc not burnt yet are formed by mixture, and no whiskers are generated.

On the contrary, if the zinc powders are coated with the perfectly-grown sealing oxide film, baking at a high temperature is uniformly and completely proceeded, so that an aggregate of whiskers of a huge specific shape is obtained with high yield, and the oxide in the film part is developed into layers finally to form dumpling zinc oxide.

As described above, the zinc powders completely coated with the oxide film can form whiskers of a specific shape, with less secondary parts or plate-like crystals formed. Therefore, if zinc powders are coated with an oxide film when they are prepared, and further subjected to grinding and maturing treatment to facilitate the formation of the oxide film, the zinc powders grow into whiskers superior both in shape and size. However, the sealing property of the oxide film is not determined only by the film thickness, and the size of whiskers varies depending on the volume ratio of the metallic part of the film (particle size), etc. Therefore, although it is possible to obtain whiskers of a specific shape even when the zinc powders are partially coated with the oxide film, the whiskers are not generated satisfactorily in shape and yield.

Further, during the baking process, particles which are to be formed into whiskers suddenly increase the volume in comparison with the specific volume of particles which are adjusted to fall down. However, this type of particles is not such one that is obtained through a general vapor-phase method outside the source but is successively formed into whiskers where the source is placed.

More specifically, if zinc metal is melted in a hot water or metallic zinc obtained from reduced zinc or zinc compound is used, and only the conditions of the baking atmosphere are selected as in the prior art, it is impossible to form whiskers in a huge specific shape. On the other hand, according to the present invention, ceramic powders are mixed with the zinc powders, so that whiskers of a huge specific shape can be realized.

In other words, the ceramic powders play a role as a substrate for the growth of whiskers at the early stage, which goes true also for the oxide film, namely, zinc oxide layer on the surface of zinc powders. The ceramic referred herein includes various kinds of metal oxides, metal composite oxides, natural minerals, particularly natural zeolite, and artificial minerals, particularly synthetic zeolite, etc. It is preferable to mix the ceramic powders with zinc powders in the heating process. Further, two or more kinds of the above ceramics may be mixed with zinc powders. If zinc powders that form a large volume of the oxide film with high fineness are used, the mixing ratio of the ceramic powders should be small, or vice versa, so that a large effect can be obtained. Moreover, some kind of ceramic powders may achieve a large effect even in a small amount, or vice versa.

In many cases, the oxide film is obtained when zinc powders are manufactured. Therefore, because the thickness and structure of the oxide film, the volume ratio between the metallic part and the oxide film, etc. act in cooperation with the mixed ceramic powders, the whiskers of a huge specific and superior shape of the present invention can be realized. The above superior shape means that the whiskers are composed of crystals substantially consisting of a core part and an acicular part extending in four different directions from the core part, without any secondary part produced. Particularly, the thickness and structure of the oxide film are determined mostly when the zinc powders are manufactured. That is to say, when zinc powders are prepared from molten zinc, the resultant oxide film is thick and relatively porous if without any particular control. On the contrary, when zinc powders are prepared through pulverization of solid zinc, the film becomes thin and fine. Although the powders in the former case form the oxide film of a better uniformity in film thickness, the latter has a complicated shape with protrusions and recesses, therefore, the oxide film becomes uneven in film thickness. The oxide film can be formed also by grinding and maturing zinc powders in water and drying. In this case, the film thickness can be increased or the part of the oxide can be enlarged. Therefore, if the zinc powders are subjected to grinding and maturing process, and mixed with ceramic powders, the secondary part is less produced, so that whiskers of a huge specific shape can be obtained. It may be possible in some cases to reduce the mixing amount of the ceramic powders owing to the grinding and maturing process.

In the event the oxide film becomes too thick, the surface thereof is fragile to cause cracks, and accordingly detached from powders. Even when this detaching part of the oxide film is mixed with zinc powders and ceramic powders, it results in the same effect.

The powders mixed with ceramic powders are, after drying, put in a heat-proof container, generally, a crucible made of metal, carbon or porcelain (porous alumina or the like) and heated in an atmosphere containing oxygen at 700°–1300° C., preferably 900°–1100° C. Thus, powders of any particle size can be formed into desired whiskers.

The prepared powders may be put in the crucible for baking after the crucible is kept in a furnace in the temperature range as above. The baking time is suitably 120–10 minutes at 700°–1300° C., or 90–10 minutes at 900°–1100° C.

Heating and baking are generally carried out in the air, but an adjusted gas with nitrogen and oxygen or an oxygen gas may be employed.

Since the oxide film on the surface of the zinc powders can be confirmed through elementary analysis, atomic absorption analysis, X-ray diffraction or electron microscopic observation, the kind and amount of the ceramics to be mixed can be determined from the result of the confirmation.

If the powders not alike those of the present invention, i.e., not mixed with other powders are used, the dumpling zinc oxide in various color tones and metallic zinc which has not yet burnt are formed by mixture, without forming whiskers, even by adjusting baking conditions, namely, temperature and oxygen concentration at baking.

On the other hand, if the powders mixed with ceramic powders are used, baking at a high temperature can be proceeded uniformly and completely, so that the metallic zinc part is completely oxidized, whereby huge whiskers of a specific shape are generated with high yield.

It is effective to use ceramic powders such as synthetic zeolite powders obtained through granulation.

During the baking process, the powders increase the volume suddenly to the apparent volume of the prepared powders. However, this is not a result of the adhesion of very small crystals outside the source as in the vapor-phase method. Fundamentally, almost all of the powders are continuously formed into whiskers where the material is placed.

Hereinafter, metallic zinc powders employed in one manufacturing method of the present invention will be described more in detail. The particle size of powders may be 0.1–500 tm, but 1–300 tm is the best. The powders can be manufactured by flame-spraying of zinc as described earlier. Conventionally, gas flame-spray or plasma jet is generally practiced wherein zinc powders or zinc rod is melted by a burning flame of oxygen-fuel gas or plasma of air, argon, hydrogen or helium, etc. and sprayed to an object in the air. It is also a general practice to form a coating film of melted zinc before it is adhered to the object under the condition not to form an oxide film. On the contrary, the present invention employs zinc powders coated with the oxide film similar to those scattering outside the object. Therefore, zinc powders for use in the present invention can be obtained by flame-spraying zinc in the air without providing an object to which zinc is to be adhered. Moreover, the film thickness of the oxide film can be increased by changing the atmosphere where the zinc is flame-sprayed from the air to a mixed gas of nitrogen and oxygen. The oxide film is remarkably useful to obtain the whiskers of the present invention, and therefore, zinc may be flame-sprayed out into the water, high humidity or high temperature place (not higher than the melting point of zinc) so as to obtain zinc powders coated with the oxide film.

In the case where the oxide film is not sufficiently formed even in the above-described method, grinding and soaking processes as mentioned above may be employed.

According to one aspect of the present invention, zinc powders are used as a material during baking process. The particle size of zinc powders may be 0.1–500 tm, and 1–300 tm shows good result since the particle size is one of the important factors to influence the generating speed of the zinc steam during baking. Specifically, when the particle size is extremely small, zinc steam is generated considerably at high speeds from the sam amount of zinc at a constant temperature not lower than an evaporating temperature of zinc metal, and therefore, control of oxygen amount in the atmosphere is substantially impossible. As a result, almost all the zinc steam is discharged outside as metallic steam (generally outside the baking furnace), or even if the zinc steam remains within the furnace, it coagulates in the metallic state or becomes zinc oxide in a dumpling state. On the other hand, if the particle size is too large, the generating speed of zinc steam is deteriorated, making it difficult to control the oxygen amount in the atmosphere so as to match to the generating amount of the zinc steam. Accordingly, zinc steam is turned into dumpling zinc oxide or into the coagulated metal, without generating desired whiskers of a specific shape.

In order to facilitate control of the generating amount of zinc steam, according to the present invention, zinc powders primarily coated with the oxide film are used for the material at baking. This is because an increase of the generating speed by the particle size can be controlled along with the progress of oxidization. Since the surface of zinc powders is coated with the oxide film, it restricts the zinc metal inside the powder particles from scattering into the atmosphere through evaporation, and the thermal capacity of the particles as a whole is increased with an apparent increase of the evaporating temperature.

As described hereinabove, because of the employment of powders as a baking material, the generating amount of zinc steam is controlled, and at the same time, the atmosphere in the baking furnace, particularly, the relative ratio of partial pressure of zinc steam and oxygen in the furnace is kept within a range to a stoichiometric ratio necessary for formation of zinc oxide, whereby zinc oxide whiskers of a specific shape of the present invention can be realized. For obtaining whiskers of a larger size, it is necessary to control the atmosphere in the forming system such that zinc steam is generated too much with insufficient oxygen to a stoichiometric value. On the other hand, for forming whiskers of a smaller size, the atmosphere should be controlled so that zinc steam is generated too little with too much oxygen.

The present invention is thus characterized in that zinc metal is baked and oxidized in the atmosphere described above. A so-called vapor-phase reaction is usually employed so as to control the atmosphere in the reaction furnace. For the vapor-phase reaction, a zone where zinc steam is generated is independently provide in the system. Zinc steam generated in the generating zone is moved to an oxidization reaction zone in the latter stage of the system by a transfer gas (concretely, non-oxidizing gas such as nitrogen or the like), where the zinc steam is oxidized by a gas containing oxygen and introduced from outside. Since the transfer gas is indispensable in the vapor-phase reaction above, it is considerably difficult to maintain the relative ratio of the partial pressure of zinc steam and oxygen within a range necessary for formation of huge whiskers, and therefore the vapor-phase reaction is almost impractical from the viewpoint of industrial yield.

Accordingly, the present invention utilizes three phases, namely, zinc powders (solid phase), molten zinc (liquid phase) and zinc steam (gas phase) and oxygen (gas phase) in the same one field. That is to say, a three-phase coexisting field is formed (but, without direct contact with the gas phase). It is accordingly smoothly carried out to form a core of zinc oxide, draw out a crystal habit of a specific shape and subsequently grow a huge crystal whisker in a specific shape, thereby enabling manufacture of whiskers with high yield. In other words, it is a key point of the present invention that a field of the partial pressure of highly concentrated zinc steam with solid zinc powders as a source is continuously formed to a zone of the partial pressure of concentrated oxygen which promotes completion of formation of whiskers.

As one method for introducing an atmosphere containing oxygen into the field of zinc steam, a circulating furnace of general type is employed, thereby to control the partial pressure of oxygen in the atmosphere and the time therefor (to control both the partial pressure of oxygen in the atmosphere corresponding to the generating amount of zinc steam and the introducing time alike). According to another method, a baking furnace having walls formed of porous and gas-permeable material is employed, whereby fresh air by the amount corresponding to the pressure reduction of the total atmosphere consequent to fixing of oxygen in the atmosphere as a result of evaporation of zinc steam inside the furnace followed by oxidization reaction is automatically introduced into the furnace from outside through the porous walls. In any of these methods, however, even when the ratio of the partial pressure between zinc steam and oxygen in the furnace is proper, the ratio in a crucible if it is made of ceramic is varied with time. In other words, oxygen is not sufficiently circulated in the ceramic crucible.

On the contrary, when a crucible of a high numerical aperture is used as in the present invention, oxygen is readily supplied into the crucible in correspondence to the change of the partial pressure of zinc steam. The numerical aperture of the crucible enabling this easy circulation of oxygen into the crucible is found out 20% or higher from the experiments. Moreover, the numerical aperture is desirably not higher than 60% so as to take out generated whiskers outside the furnace conveniently. That is, if the numerical aperture is 60% or higher, a considerable amount of generated whiskers overflow from the opening of the crucible.

Even when zinc powders which are more alike to pure zinc, with generating zinc steam at high speeds and forming less oxide film are used, zinc oxide whiskers of a specific shape can be obtained with high yield. Therefore, the crucible employed in the present invention is clearly effective for an easy circulation of oxygen.

Furthermore, according to an aspect of the present invention wherein a partition plate is provided in the crucible, since the upper section of the partition plate is away from the source of zinc steam and filled with the air, the concentration of zinc steam is low there with too much oxygen, and accordingly zinc oxide whiskers of specific 3-30 tm shape are generated and piled above the partition plate. On the other hand, in the lower section of the partition plate which is adjacent to the source of zinc steam, the concentration of zinc steam is high with insufficient oxygen and accordingly, zinc oxide of specific 30-250 tm shape is formed. The generating speed of zinc steam during the baking process is greatly influenced by the particle size of zinc powders. Namely, when the particle size is extremely small, the generating speed of zinc steam from the same amount of the zinc metal is considerably fast at a fixed temperature not lower than the evaporating temperature of the zinc metal, making it substantially impossible to control the oxygen amount in the atmosphere. Consequently, almost all of the zinc steam is discharged out of the forming system of crystals generally outside the baking furnace) as it is, or even if it remains within the forming system, it coagulates in the metallic state or becomes dumpling zinc oxide depending on conditions of the atmosphere. It is turned into acicular (like a shell of sea urchin) sinter or a plate-like substance. If the particle size is too large, the generating speed of zinc steam is reduced, whereby control of the oxygen amount in the atmosphere to fit for the generating amount of zinc steam is difficult. The zinc steam results in dumpling or coagulated metallic zinc oxide, not whiskers of a specific shape.

According to the present invention, zinc powders which are not coated with the oxide film or are mixed with zinc oxide rather than pure zinc powders are used for baking material so as to control easily the generating amount of zinc steam. This is because an increase of the generating speed of zinc steam can be restricted by the oxidization reaction. Since the surface of zinc metal particles is coated with the oxide film, it is effective to control the zinc metal inside particles from evaporating and scattering into the atmosphere, and the thermal capacity of particles is increased as a whole with an apparent rise of the evaporating temperature.

Accordingly, by using powdered material as a baking material, the generating amount of zinc steam and atmosphere in the baking furnace, particularly the partial pressure of oxygen can be controlled, so that the relative ratio of the partial pressure between zinc steam and oxygen in the furnace can be held within a range to a stoichiometric ratio necessary for forming zinc oxide. As a result, zinc oxide whiskers of a specific shape can be generated. Whiskers of a larger size can be obtained by controlling the atmosphere such that zinc steam is generated too much and oxygen is not sufficiently supplied to a stoichiometric value, whereas whiskers of a smaller size can be obtained by controlling the atmosphere in a manner reverse to the above.

The present invention is characterized in baking and oxidization process of zinc metal under the atmosphere controlled in the above-described fashion. Although it is a general practice called a vapor-phase reaction to move zinc steam generated in a zone separately provided from the reaction zone to the latter zone by a carrier gas (concretely, non-oxidizing gas such as nitrogen), where zinc steam is oxidized by oxygen gas led from outside, this practice is almost impossible in terms of industrial yield since the carrier gas is a must and accordingly the relative ratio of the partial pressure between zinc steam and oxygen is extremely difficult to be controlled in a range necessary for formation of huge whiskers.

The present invention realizes such atmosphere necessary for formation of huge whiskers by allowing zinc powders (solid), molten zinc (liquid), zinc gas (gas) and oxygen (gas) to be mixed in the same field (however, liquid zinc is in the width of the oxide film), that is, a three-phase coexisting field, solid-liquid-gas phase coexisting field is formed. It is smoothly carried out to form a core of zinc oxide, draw out a crystal habit of a specific shape and grow huge whiskers of a specific shape, thereby achieving a highly efficient manufacture of zinc oxide whiskers. It is a characteristic feature of the present invention that the partial pressure field of concentrated zinc steam having solid zinc powders as a source is formed successively to the partial pressure field of concentrated oxygen facilitating the formation of whiskers.

Concretely speaking, in order to obtain the above-described atmosphere containing oxygen and introduce the same to the zinc steam field, a general circulating furnace is employed in the present invention to control the partial pressure of oxygen in the introducing atmosphere and the time thereof (to control the partial pressure of oxygen in the atmosphere corresponding to the generating amount of zinc steam and time therefor), or, a baking furnace having walls formed of porous and gas-permeable material is employed to automatically circulate fresh air through porous walls into the furnace by the amount corresponding to the reduced pressure in the atmosphere as a result of evaporation of zinc steam and fixing of oxygen due to succeeding oxidization reaction.

In case of the circulating furnace, the feed amount of zinc powders and the feed amount of atmospheric gas (partial pressure of oxygen) so that a predetermined atmosphere is formed under the temperature conditions in the reaction field necessary to oxidize zinc are controlled from outside. On the other hand, in case of the baking furnace of porous walls, oxygen is automatically supplied through the walls of the furnace along with the progress of the oxidization reaction if the material of furnace walls is selected to have a proper gas permeability. Therefore, in the case of the baking furnace, no time control is required during the progress of reaction if the atmosphere (partial pressure of oxygen) outside the furnace is set properly.

The present invention is further characterized in that at least one of carbon dioxide and steam which is considered not contributive to oxidization reaction is mixed in the atmosphere together with oxygen in the baking process of zinc metal. It was found out from a number of experiments that the mixing ratio of carbon dioxide and steam alone or together in the atmosphere changes the distribution of shape and size of generated zinc oxide. Although the effect of these mixtures is not clearly distinguished in detail, when the mixing ratio is over a certain value, the mixtures hardly influence generated zinc oxide, whereas, when the mixing ratio is lower than the certain value, the yield and shape of generated zinc oxide are certainly influenced by the mixing ratio. More specifically, as the concentration of oxygen becomes smaller than the certain value to that of carbon dioxide or steam in the atmosphere, zinc oxide of a specific shape is produced less in smaller size. However, the distribution of size of obtained zinc oxide whiskers when carbon dioxide or steam is mixed is remarkably small in comparison with that of whiskers obtained without the mixture.

Accordingly, the mixture (carbon dioxide or steam) with oxygen in the atmosphere is effective to restrict the formation of zinc oxide of a specific shape and growth of crystals as well, consequently interrupting adsorption or scattering of oxygen to the surface of zinc oxide crystals. Carbon dioxide shows larger force than steam to restrict the formation and growth of zinc oxide. It is natural that the simultaneous mixture of both carbon dioxide and steam is also influential to the formation and growth of zinc oxide of a specific shape.

BRIEF DESCRIPTION OF THE DRAWINGS

These and other objects and features of the present invention will become apparent from the following description taken in conjunction with preferred embodiments thereof with reference to the accompanying drawings, in which.

DETAILED DESCRIPTION OF THE INVENTION

The present invention will be discussed hereinbelow in a detailed manner in conjunction with preferred embodiments and comparative examples thereof.

Embodiment 1

Zinc wire, 99.99% purity, is flame-sprayed through ark discharge into an atmosphere composed of mixed gas of oxygen and nitrogen. The concentration of oxygen is 27% and the temperature of the atmosphere is set at 40° C.

Zinc powders of the particle size 150–300 tm are classified from the obtained zinc powders and dried at 150° C. for 24 hours for subsequent baking. 120 g powders are scattered 3 mm uniformly on the bottom surface of a crucible made of porous alumina porcelain. The crucible is a rectangular parallelepiped, 20 cm wide, 35 cm long and 15 cm deep. One surface of the wide area of the crucible is rendered an opening confronting to the bottom surface. The container, namely, crucible containing the zinc powders is led into a furnace maintained at 960° C. and heated in the atmospheric air for 35 minutes. As a result of this, slightly yellow dumpling zinc oxide is generated in layers in the lower part of the container, with an aggregate of huge zinc oxide whiskers having an apparent specific gravity 0.11 formed in the upper part thereof. Only a little amount of whiskers overflow outside the container, but the reaction is mainly conducted within the container. While the particles of zinc powders at a high temperature in the early stage of reaction rise upward to the opening of the container and fall down therefrom repeatedly, whiskers are continuously generated as a result of the oxidization reaction. At this time, although some whiskers overflow, the reaction is continued within the container, and accordingly the generated substance is almost all piled in the container.

The ratio of the aggregate of whiskers to the generated zinc oxide is 88% and the remaining 12% is dumpling zinc oxide. The obtained whiskers are shown in a photograph by an electron microscope in FIG. 1.

As is clear from the photograph, each whisker is a crystalline body consisted of a core part and an acicular part extending in four different directions from the core part. Some whiskers are plate-like crystals. In Embodiment 1, anyway, huge whiskers are generated 85% or more.

Figure 1:
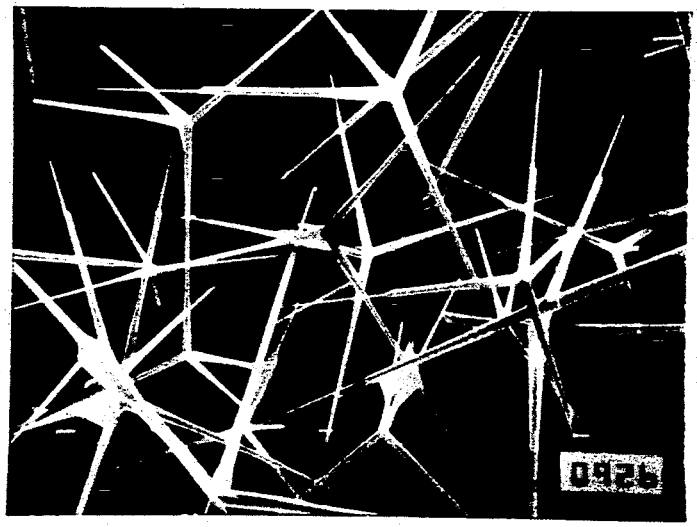
FIGS. 1 and 3-7 are photographs taken by an electron microscope showing the crystal structure of zinc oxide whiskers according to the present invention.
Figure 2:
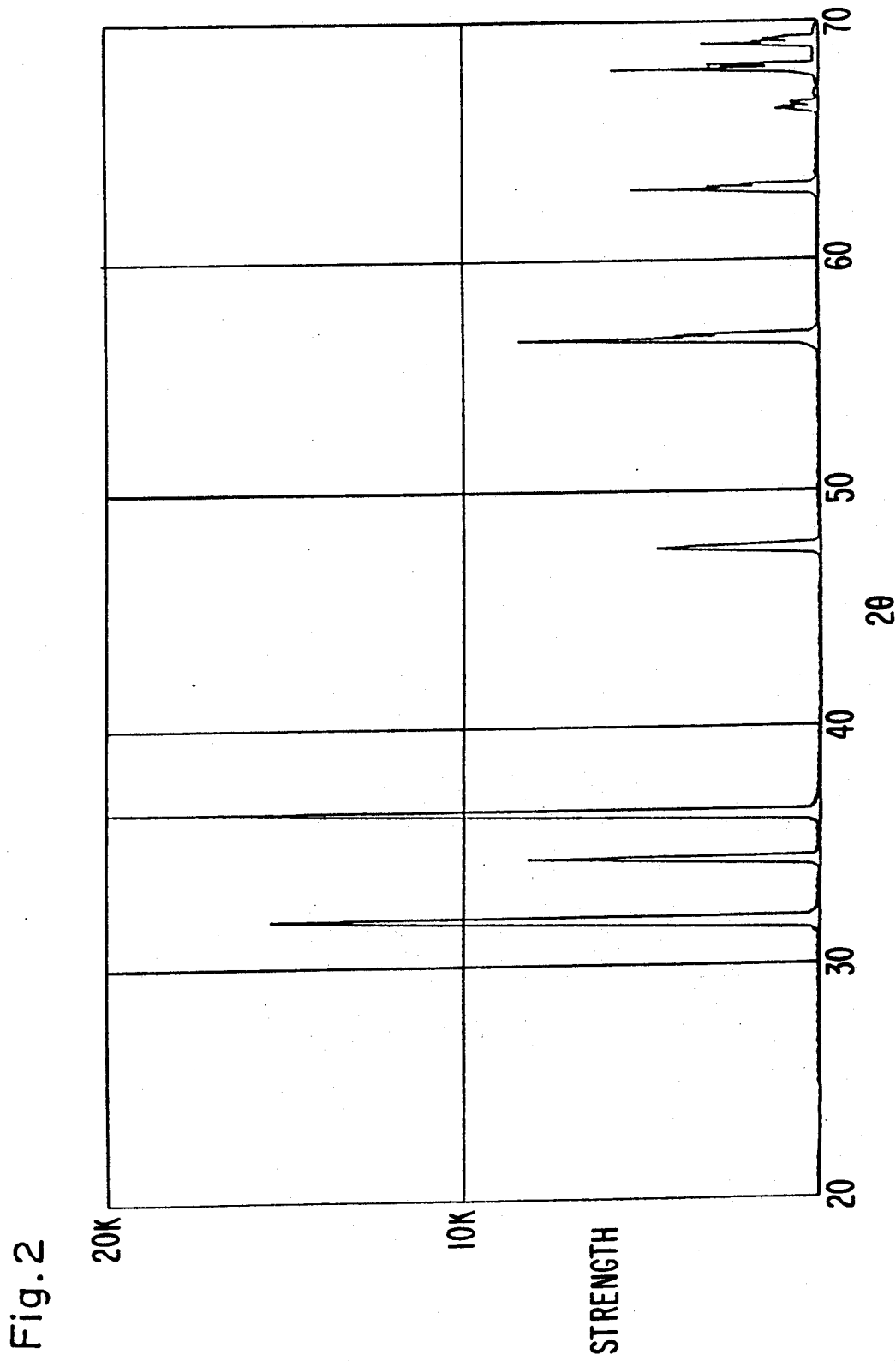
FIG. 2 is a view of an X-ray diffraction.

FIG. 2 is a view of an X-ray diffraction of the whiskers of FIG. 1. The whiskers represent the peak of zinc oxide. The result of an electron beam diffraction also indicates the whiskers are single crystals with less transition and lattice defect. Impurities are contained little. Zinc oxide is obtained 99.97% when measured through an atomic absorption analysis.

Embodiment 2

The same pure zinc wire is flame-sprayed in the same manner as in Embodiment 1. Immediately thereafter, zinc powders are collected and added with an ion exchange water, 550 g water to 1 kg powders, stirred by a mortar grinder for 25 minutes, left in 20° C. water for 75 hours for maturing. The water level is maintained about 1 cm from the layer of powders when the powders are left in the air. Then, the powders are dried at 130° C. for 3 hours, thereby removing the moisture therefrom. The powders are put in a porous alumina container in a scattering manner. The container is 40 cm wide, 50 cm long and 30 cm deep, having an opening at one wide area surface thereof. The zinc powders are uniformly scattered 200 g not higher than 3 mm. The container is led into a furnace which has been maintained at 970° C. beforehand, where zinc powders are baked and oxidized for 30 minutes. The state of the piling substance and zinc particles during the reaction are the same as in Embodiment 1. Huge zinc oxide whiskers are formed in an aggregate in the upper part of the container, having a specific gravity 0.09. 84% of the generated substance is the aggregate of whiskers.

Figure 3:

The obtained whiskers are shown in a photograph by an electron microscope in FIG. 3. Not less than 89% is the whiskers of a specific shape. The X-ray diffraction and electron beam diffraction show the same result as in Embodiment 1. The atomic absorption analysis shows that 99.99 wt % or more is zinc oxide.

Embodiment 3

Figure 4:
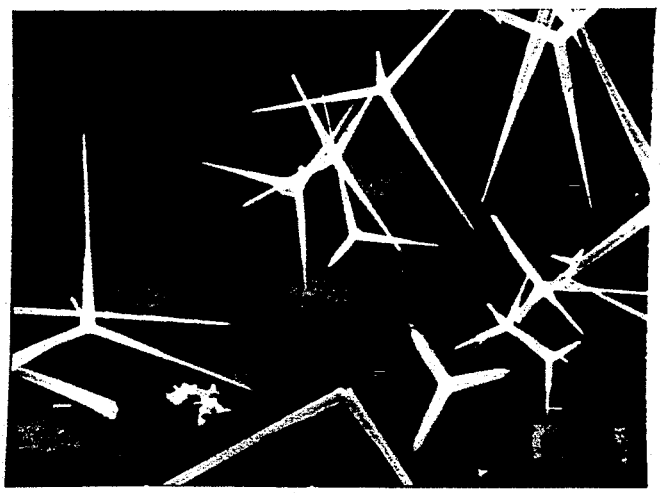

Zinc powders are prepared through mechanical pulverization. A base metal, 99.99% or higher purity, is cut, roughly pulverized 5 times by a jaw crusher and finely pulverized 10 times by a stamp mill. The powders are crushed and pulverized in the air. Only zinc powders of the particle size 50–300 tm are classified, which are baked in a furnace at 970° C. for 35 minutes in an atmosphere of mixed gas, namely, 25% oxygen and the remaining nitrogen. A container is made of silicon carbide, 20 cm wide, 40 cm long and 20 cm deep rectangular parallelepiped. One surface of the container of the wide area is opened. The other conditions are the same as in Embodiment 1. As a result, whiskers are obtained 84 wt % with an apparent specific gravity 0.1, the remaining 16% being dumpling zinc oxide. FIG. 4 shows the whiskers photographed by an electron microscope. 81% is the whiskers in a specific shape having acicular parts extending in four directions. The X-ray diffraction and electron beam diffraction show the same result as in Embodiment 1. Moreover, the atomic absorption analysis finds 99.97 wt % or more zinc oxide.

Embodiment 4

Similar to Embodiment 3, zinc powders are mechanically pulverized. Further, 500 g ion exchange water is added to 1 kg powders, which is in turn stirred by a mortar grinder for 10 minutes and then left in 25° C. water for 90 hours to mature. Subsequently, the moisture is removed from the powders by drying the powders at 150° C. for 12 hours. The prepared powders are subjected to baking as in Embodiment 3, resulting in 75 wt % whiskers with a specific gravity 0.09. 25 wt % of the generated substance is dumpling zinc oxide powders.

Figure 5:
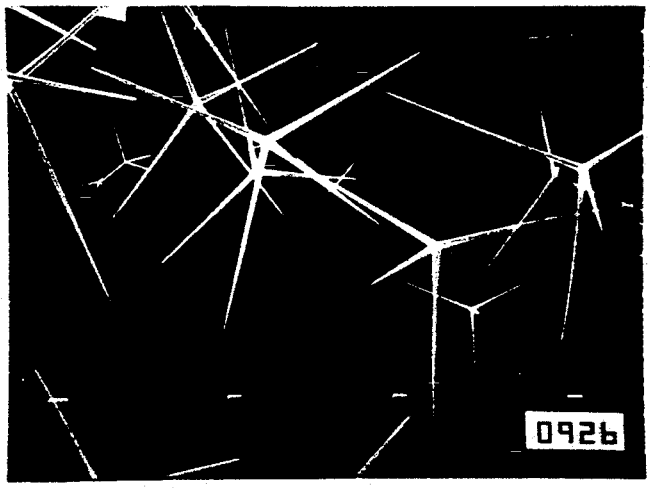

The obtained whiskers are shown in a photograph of FIG. 5 taken by an electron microscope. 92% of the whiskers are in a specific shape. The result of the X-ray diffraction and electron beam diffraction is identical to that of Embodiment 1. Zinc oxide is found 99.99 wt % from an atomic absorption analysis of the whiskers.

The container is the same as employed in Embodiment 3 under the same reaction conditions.

Embodiment 5

Spherical zinc powders obtained through volatilization and condensation are used. A base metal of zinc, 99.97 wt % purity, is placed in a porcelain container and kept at 970° C., thereby allowing the zinc to volatilize.

The evaporated zinc is condensed at a room temperature in the air. Powders of the average particle size 7.5 tm are classified for baking. The powders are baked in a container made of silicon carbide of the same size and under the same conditions as in Embodiment 1. However, the baking temperature and time are set different 990° C. and 25 minutes. The atmosphere is the air. Zinc particles behave in the same manner during the reaction as in Embodiment 1, generating the same piling substance.

Figure 6:
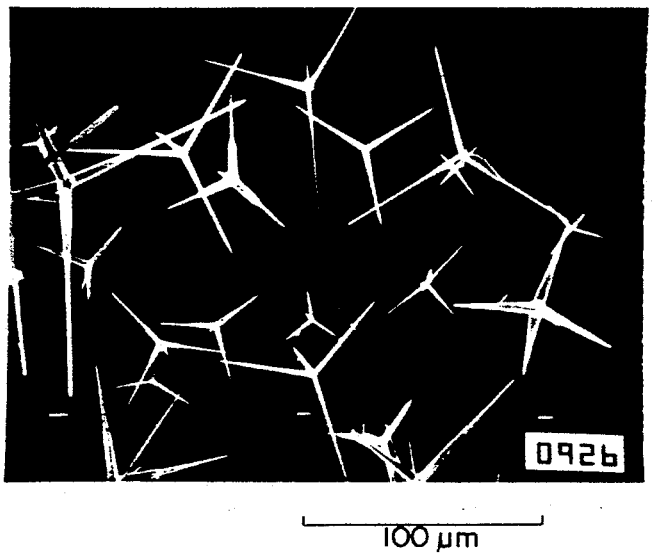

Whiskers are formed 92 wt % with a specific gravity 0.09, with the rest being dumpling zinc oxide. FIG. 6 is a photograph of the obtained whiskers taken by an electron microscope. 90% or more of the whiskers are in a specific shape although the acicular parts are smaller in size as compared with those of the whiskers obtained in Embodiments 1-4. The X-ray diffraction, electron beam diffraction and atomic absorption analysis show the same result as in Embodiment 1.

Embodiment 6

Zinc powders used in Embodiment 5 are used here. 1 kg zinc powders are put in 500 mg water and mixed by a grinder for 5 minutes, then left in 30° C. water for 91 hours. Subsequently, the powders are dried at 110° C. for 24 hours to remove the moisture therefrom. The prepared powders are oxidized under the same conditions as in Embodiment 5, whereby whiskers with a specific gravity 0.09 are obtained 84 wt %. The rest is zinc oxide in a dumpling state.

Figure 7:
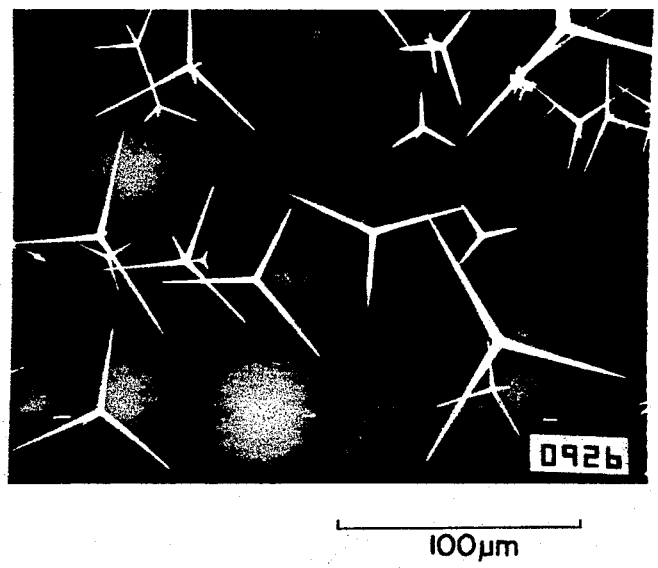
Figure 8:
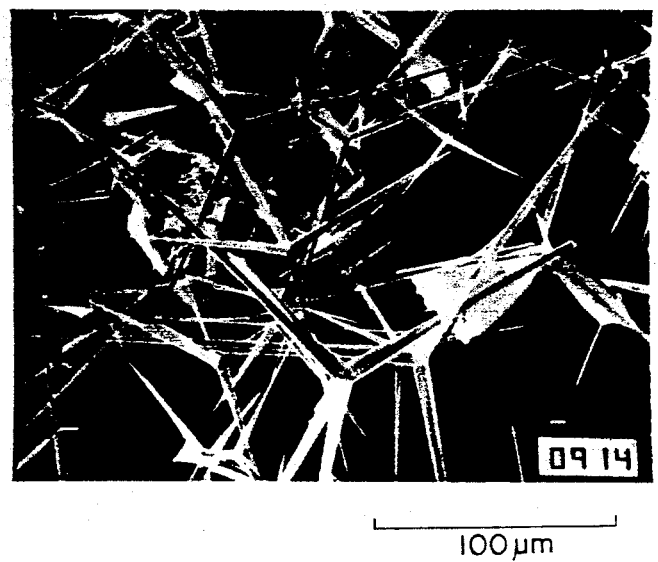
FIGS. 8 and 9-13 are photographs taken by an electron microscope showing the crystal structure of zinc oxide whiskers according to the present invention.

A photograph by an electron microscope of FIG. 7 indicates the obtained whiskers. 95% or more of the whiskers are in a specific shape, having the acicular parts smaller in size, similar to in Embodiment 5, in comparison with those obtained in Embodiments 1-4. The X-ray diffraction, electron beam diffraction and atomic absorption analysis show the same result as in Embodiment 1.

Embodiments 1-6 discussed hereinabove will be tabulated in Table 1.

Embodiment 7

Zinc wire, 99.99% purity, is flame-sprayed through ark discharge, into the mixed gas atmosphere composed of oxygen and nitrogen. The concentration of oxygen is 41%. The atmosphere is set at 50° C. Zinc powders of the particle size 106-300 tm are classified and further dried at 150° C. for 24 hours. The temperature when the evaporation starts is found 715° C. from a thermal gravimetric analysis. 120 g zinc powders placed in a crucible made of porous alumina porcelain are heated for about 35 minutes in a furnace which has been maintained at 960° C. beforehand.

Consequently, slightly yellow zinc oxide in a dumpling state is generated in layers in the lower part of the crucible, and an aggregate of huge zinc oxide whiskers in a specific shape with an apparent specific gravity 0.12 are generated in the upper part of the crucible. The aggregate occupies 89 wt % in the generated zinc oxide. The remaining 11 wt % is dumpling zinc oxide.

The obtained zinc oxide whiskers are shown in a photograph taken by an electron microscope in FIG. 4. A crystalline body of a specific shape, namely, comprised of a core part and an acicular part extending in four different directions from this core part is clearly recognized in this photograph. The acicular part has the diameter 3-6 tm at its joint, and length 50-150 tm. Although some acicular parts extend in two or three different directions, these may be caused when the whiskers are partially brought in contact with the other ones during or after the growth. Plate-like crystals are observed as well. However, 80 wt % or more is whiskers of a huge specific shape in this Embodiment.

The whiskers show the peak of zinc oxide by the X-ray diffraction, and it is confirmed from the electron beam diffraction that the whiskers are single crystals having less transition and lattice defect. Moreover, impurities are contained less. Zinc oxide is found 99.98 weight % from the atomic absorption analysis.

Embodiment 8

The same zinc wire as used in Embodiment 7, 99.99% purity is flame-sprayed into the air through ark discharge, and immediately thereafter, 1 kg of the obtained powders are put into 500 g ion exchange water and stirred by a mortar grinder for 20 minutes. Then, the powders are left in 20° C. water for 72 hours to mature. The water level is kept about 1 cm from the layer of powders, and in this state the powders are left in the atmospheric air. The powders are subsequently subjected to drying treatment at 150° C. for 30 minutes, so that the moisture is removed from the powders. A thermal gravimetric analysis reveals the starting temperature of evaporation is 740° C. The powders are put in a crucible made of porous alumina porcelain which in turn is placed in a furnace primarily kept at 1000° C. for heating about one hour.

As a result of this, dumpling zinc oxide is generated in the lower part of the crucible, with an aggregate of huge zinc oxide whiskers of a specific shape with an apparent specific gravity 0.09 being formed in the upper part of the crucible. The aggregate of whiskers is 86 wt % to the generated substance, while the dumpling zinc oxide is 14 wt %.

Figure 9:
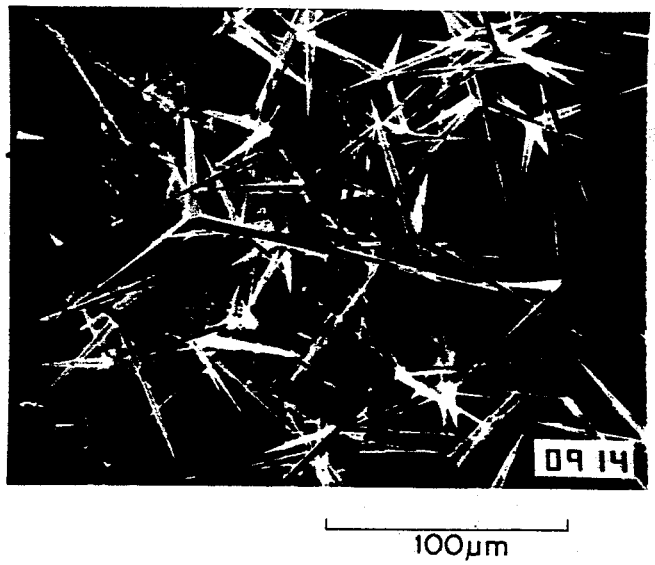

A photograph by an electron microscope shown in FIG. 9 represents the obtained zinc oxide whiskers. Zinc oxide whiskers of a specific shape is not less than 80 wt %. The result of the X-ray diffraction and electron beam diffraction is the same as in Embodiment 1. The atomic absorption analysis shows zinc oxide 99.98 wt % or more among the obtained substance.

Embodiment 9

Figure 10:
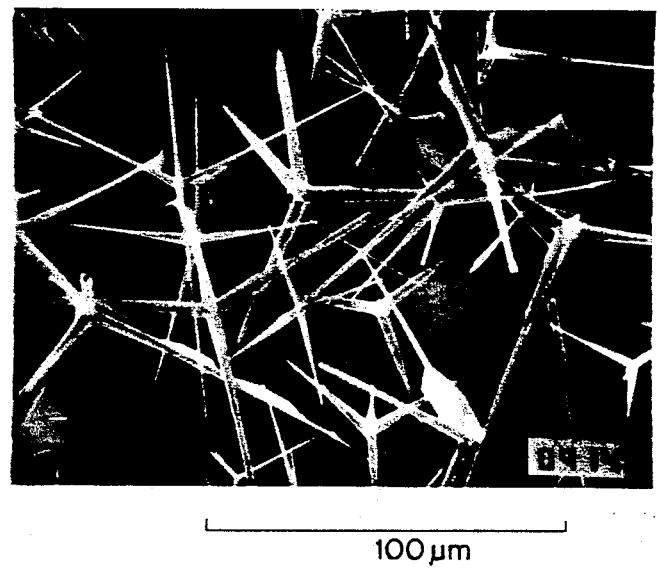

Powders which are mechanically pulverized are used. That is, a base metal of 99.99% purity zinc is cut, pulverized roughly five times by a jaw crusher and further pulverized for 12 hours by a stamp mill, thereby to obtain fine powders. The powders are pulverized in the air. Among the pulverized powders, those of a particle size 100-400 tm are classified. A starting temperature of evaporation is found 771° C. from a thermal gravimetric analysis. The powders are baked at 970° C. for 40 minutes. The other processes go the same way as in Embodiment 7. Whiskers are obtained 89 wt % with an apparent specific gravity 0.1, and dumpling zinc oxide is found 11 wt %. These whiskers are observed by an electron microscope, which is shown in a photograph of FIG. 10. The X-ray diffration and electron beam diffraction result the same as in Embodiment 7. Zinc oxide is 99.97 wt % to the obtained whiskers from the atomic absorption analysis.

Embodiment 10

Figure 11:
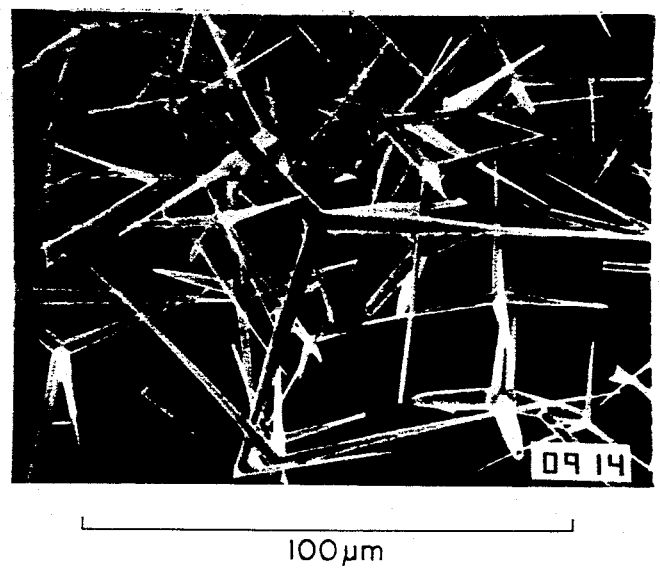

Similar to Embodiment 9, powders are prepared by mechanical pulverization. 1 kg powders are added with 400 mg ion exchange water, stirred by a mortar grinder for 10 minutes and left for 96 hours in 25° C. water. After the powders are matured in the water, they are dried at 150° C. for 12 hours to remove the moisture therefrom. A starting temperature of evaporation of powders is 790° C. through a thermal gravimetric analysis. The powders are then baked in the same manner as in Embodiment 3. Thus, the obtained whiskers have an apparent specific gravity 0.09. 72 wt % is whiskers, and 28 wt % is dumpling zinc oxide. The generated whiskers are seen in a photograph by an electron microscope of FIG. 11. 89 wt % of the whiskers represent a specific shape. The X-ray diffraction and electron beam diffraction show the same results as in Embodiment 7. The atomic absorption analysis of the whiskers show zinc oxide 99.99 wt % or more.

Embodiment 11

Figure 12:
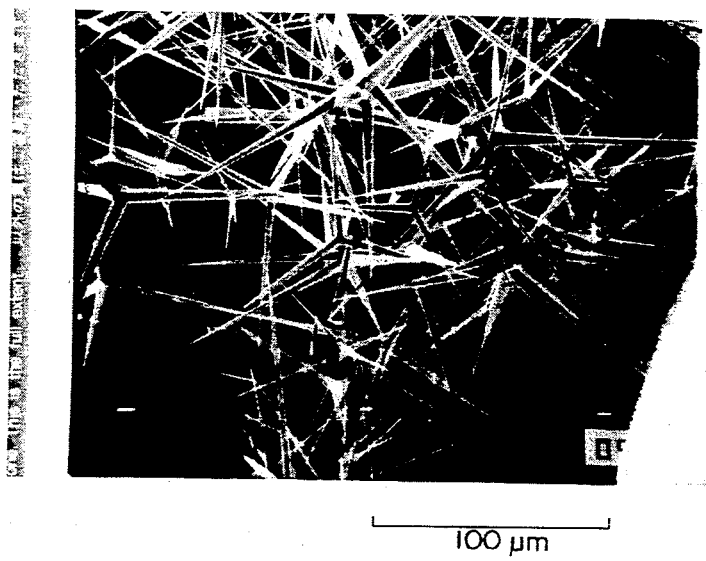

Spherical zinc powders through volatilization and condensation are employed in this Embodiment 10. Zinc base metal, 99.97% purity, is placed in a porcelain container which is kept at 750° C., thereby to volatilize the zinc. The volatilized zinc is condensed at a room temperature in the air. Then, powders of an average particle size 7.5 tm are classified. The evaporation starting temperature is 810° C. through a thermal gravimetric analysis. The zinc powders are subjected to baking for 32 minutes in the same manner as in Embodiment 1, but, the baking furnace is maintained 950° C. Whiskers are obtained 92 wt %, showing an apparent specific gravity 0.09, and the remaining 8 wt % is dumpling zinc oxide. The whiskers are indicated in FIG. 12 which is a photograph taken by an electron microscope. 85% or more of the whiskers represent a specific shape, with the acicular parts smaller in size than those of whiskers obtained in Embodiments 1-10. The X-ray diffraction and electron beam diffraction show the same result as in Embodiment 7, while the atomic absorption analysis indicates that zinc oxide is 99.87 wt %.

Embodiment 12

Figure 13:
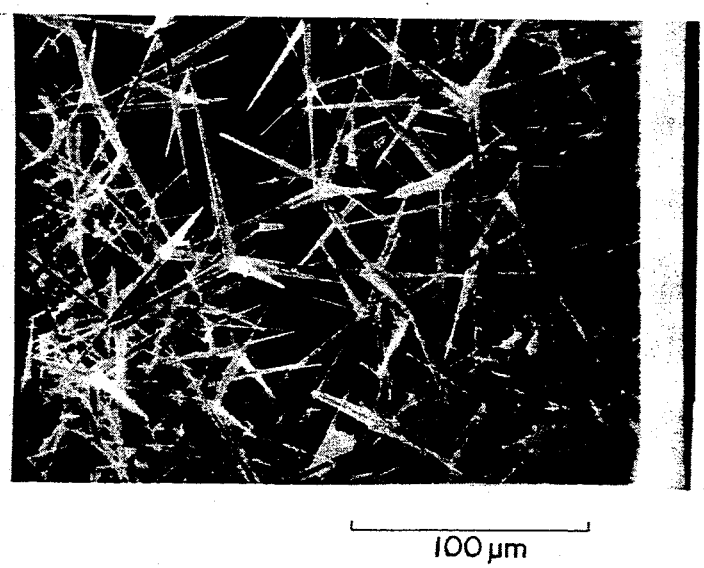

Spherical zinc powders are prepared through volatilization and condensation as in Embodiment 11. 1 kg spherical powders are put in 500 mg water and stirred by a mortar grinder for 5 minutes. Then, the powders are left in 27° C. water for 72 hours. Thereafter, the moisture is removed from the powders by drying the latter at 110° C. for 48 hours. According to the thermal gravimetric analysis, the starting temperature of evaporation is 801° C. Baking conditions of the powders are maintained the same as in Embodiment 11. The generated whiskers are 87 wt % with an apparent specific gravity 0.09, and 13 wt % is dumpling zinc oxide. The whiskers are shown in a photograph by an electron microscope of FIG. 13. 90% or more of the whiskers show a specific shape, having relatively smaller acicular parts than the whiskers of Embodiment 11.

The foregoing Embodiments 7-12 will be tabulated in Table 2.

Comparative example 1

Zinc wire having the same purity as that of Embodiment 7 is flame-sprayed in the nitrogen atmosphere through ark discharge. The atmosphere to which the zinc wire is sprayed is also nitrogen atmosphere maintained at 5° C. with the relative humidity 20%. The evaporation starting temperature of these powders is 540° C. through the thermal gravimetric analysis. Powders of a particle size 150-200 tm are classified and baked under the same conditions as in Embodiment 7, only to result in a little amount of huge whiskers of a specific shape. A large part of the generated substance is a mixture of dumpling zinc oxide and metallic zinc formed in layers.

Embodiment 13

Figure 14:
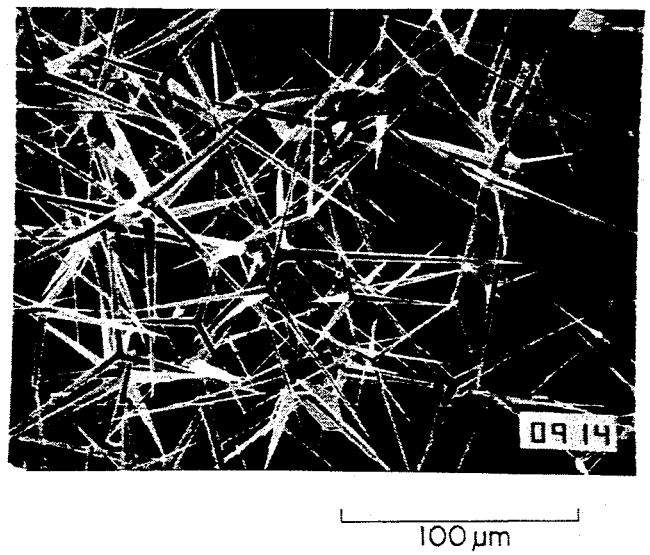
FIGS. 14-16 are photographs taken by an electron microscope showing the crystal structure of zinc oxide whiskers according to the present invention.

Zinc powders are manufactured by an atomizing method. The air is used as a pressuring medium for atomizing the powders. The obtained powders are spherical powders with the particle size 60-200 tm. The purity of zinc is 99.5%. Synthetic zeolite (molecular sheaves 3A) is mixed by 40% weight ratio to the powders, which is placed in a crucible made of alumina porcelain into a heating furnace kept at 975° C. for heating for 35 minutes. Consequently, dumpling zinc oxide and synthetic zeolite are piled in the lower part within the crucible, while an aggregate of huge zinc oxide whiskers of a specific shape with a specific gravity 0.12 is formed in the upper part of the crucible. The aggregate is 81 wt % of the generated zinc oxide. A photograph by an electron microscope in FIG. 14 shows the obtained zinc oxide whiskers. As is clear from this photograph, each whisker is a crystalline body in a specific shape, i.e., composed of a core part and an acicular part extending in four different directions from the core part. Although some whiskers have the acicular parts extending in three or two directions, these are brought about as a result of the contact with the other whiskers during the growth or thereafter. A plate-like crystal is rarely generated. According to this Embodiment anyway, 87 wt % or more is the whiskers of a specific shape. The X-ray diffraction of the whiskers indicates the peak of zinc oxide, and the electron beam diffraction confirms the whiskers of single crystals with fairly less transition and lattice defect. In addition, impurities are contained little. 99.98% is zinc oxide from the atomic absorption analysis.

Embodiment 14

Zinc wire having 99.99% purity is flame-sprayed into the air through ark discharge, so that metallic zinc powders are obtained. The powders are coated with an oxide film on the surface thereof, which is recognized from the electron microscopic analysis and oxygen elementary analysis. The powders are mixed with the same synthetic zeolite by 15 wt % as used in Embodiment 1, and baked at 990° C. for 25 minutes. The other conditions are kept the same as in Embodiment 13.

Figure 15:
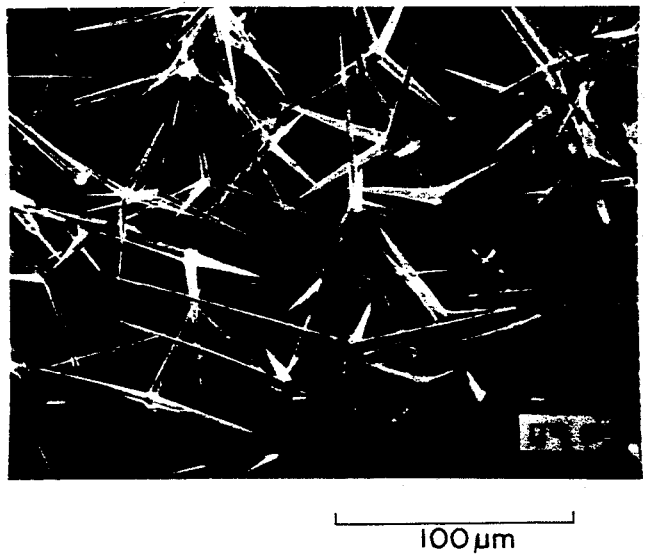

Thus, zinc oxide whiskers are obtained 70 wt % with specific gravity 0.1. The rest is dumpling zinc oxide. The weight of the mixed synthetic zeolite is not changed before and after the reaction. The whiskers are shown in a photograph by an electron microscope in FIG. 15. Approximately 90 wt % of the whiskers are in a specific shape, with a considerably small amount of secondary plate-like crystals. The result of the X-ray diffraction and electron beam diffraction is the same as in Embodiment 13, while the atomic absorption analysis shows 99.96% zinc oxide.

Embodiment 15

Figure 16:
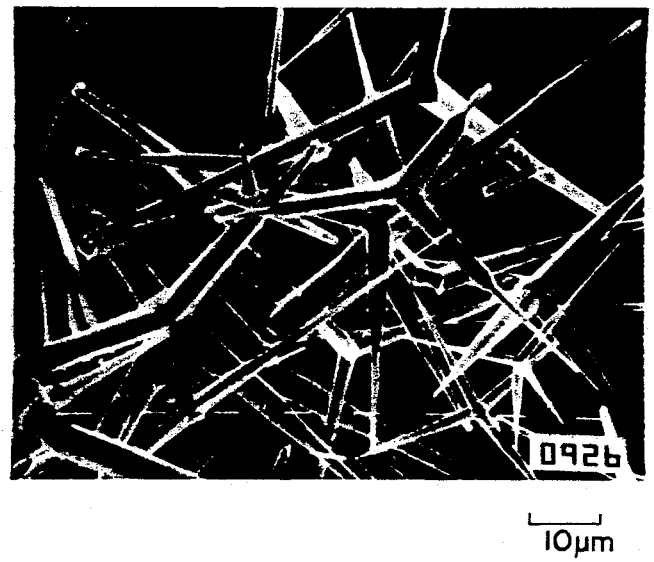

Zinc powders obtained through ark discharge in Embodiment 14 are used here. The zinc powders are mixed with an ion exchange water by the ratio, 1 kg powders to 700 g water, and stirred by a mortar grinder for 10 minutes. Then, the powders are left in 31° C. water for 72 hours. The water level is kept about 1 cm above the layer of powders, preserved in the air. Thereafter, the powders are dried at 150° C. for 12 hours. Active alumina is added 7 wt % to the powders, then baked for 35 minutes at 1000° C. The other processes go the same manner as in Embodiment 13. As a result, huge zinc oxide whiskers having an apparent specific gravity 0.1 are obtained 75%. The rest is dumpling zinc oxide. It is to be noted here that the mixed active alumina shows no change in its weight before and after the reaction. The resultant whiskers are shown in a photograph by an electron microscope in FIG. 16. 94 wt % is whiskers of a specific shape, and secondary plate-like crystals are formed little. The X-ray diffraction and electron beam diffraction show the same result as in Embodiment 13. Zinc oxide is 99.97% from the atomic absorption analysis.

When ceramic powders are not added in Embodiments 13-15, obtained zinc oxide whiskers are relatively irregular and not uniform in shape, with much more plate-like crystals adhered.

Figure 17:
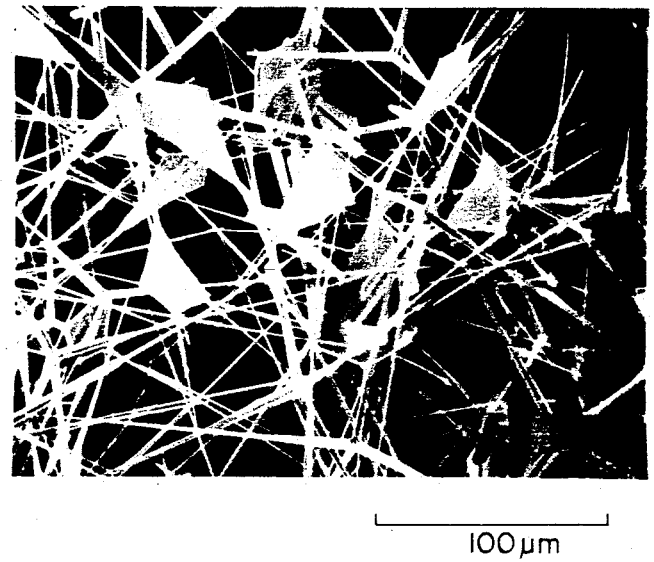
FIGS. 17-19 are photographs taken by an electron microscope showing the crystal structure of comparative whiskers.
Figure 18:
Figure 19:

Comparative examples 2-4 respectively corresponding to Embodiments 13-15 are indicated in FIGS. 17-19 of an electron microscopic photograph. The X-ray diffraction and electron beam diffraction and, atomic absorption analysis of the Comparative examples do not reveal a great difference from Embodiments 13-15. The dumpling zinc oxide is piled by the amount not greatly different from Embodiments 13-15. Moreover, in case where magnesium oxide, silicon oxide, barium titanate, cuprous oxide, iron oxide, etc. is used for ceramic powders, it brings about the same result as in Embodiments 13-15.

Embodiments 13-15 and respective comparative examples 2-4 are tabulated in Table 3.

Embodiment 16

Zinc wire, 99.99% purity, is flame-sprayed through gas spray. The zinc wire having the diameter 1.5 mm is turned into gaseous state by a burning flame of oxygen-liquefied natural gas and sprayed out into the air with the relative humidity 60%. The flame-spraying speed is set 6 kg/hour. The collected powders are left in an atmosphere, 50% relative humidity, for 24 hours, and then dried at 120° C. for 3 hours. The powders are put in an alumina porcelain crucible, placed in an electric furnace maintained at 970° C. and baked for 25 minutes. As a result, dumpling zinc oxide is generated in the lower part of the crucible, and an aggregate of huge zinc oxide whiskers of a specific shape with an apparent specific gravity 0.11 is formed in the upper part of the crucible. The aggregate of whiskers is 87 wt % of the generated zinc oxide.

Figure 20:
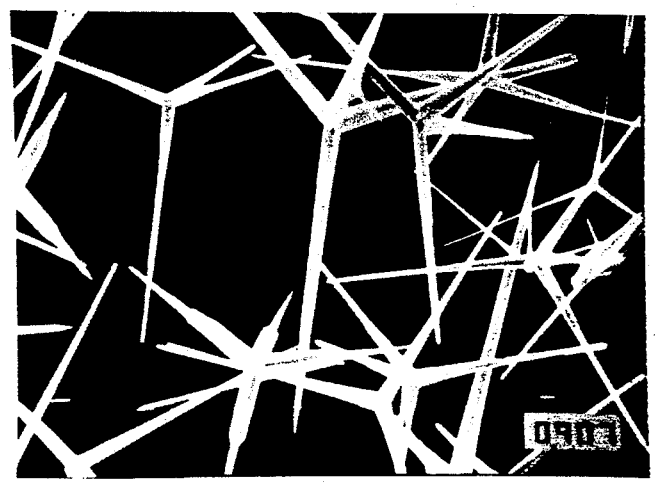
FIGS. 20-25 are photographs taken by an electron microscope showing the crystal structure of huge zinc oxide whiskers according to the present invention.

The obtained whiskers are seen in a photograph by an electron microscope of FIG. 20. From this FIG. 20, crystalline bodies in a specific shape are definitely recognized. Some whiskers grow acicular parts extending in three or two different directions, but, this is regarded as a result of a break in contact with the other whiskers caused before or after the growth thereof. More or less plate-like crystals are observed. According to this Embodiment, however, 90 wt % or more is the whiskers of a specific shape.

The X-ray diffraction of all the obtained zinc oxide whiskers shows the peak of zinc oxide. Also, the electron beam diffraction shows that the whiskers consist of single crystals with less transition or lattice defect. Impurities are contained little. Zinc oxide is generated 99.97% as confirmed by the atomic absorption analysis.

Embodiment 17

Zinc wire, 99.91% purity, is flame-sprayed in the same manner as in Embodiment 16. The generated powders are left 10 days at 31° C. in an atmosphere of 75% relative humidity. Thereafter, the powders are put in an ion exchange water by the ratio, 700 g powders to 500 g water, and stirred for 25 minutes by a mortar grinder. Then, the powders are left in 30° C. water for 72 hours, which is kept in the air to mature. The water level is approximately 1 cm above the layer of powders. After the powders are dried at 150° C. for one hour to remove the moisture therefrom, the powders are baked in the same manner as in Embodiment 16. The baking temperature and time are 960° C. and 30 minutes.

Figure 21:
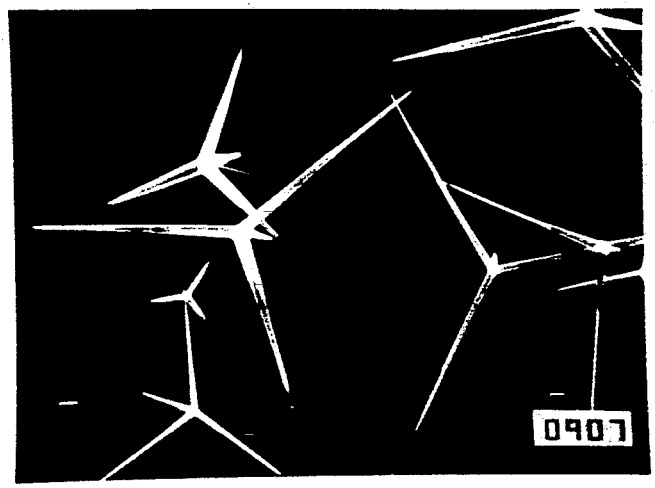

Consequently, 81 wt % zinc oxide whiskers with an apparent specific gravity 0.13 are obtained. The rest is dumpling zinc oxide in the lower part of the crucible. The whiskers are shown in a photograph by an electron microscope of FIG. 21. 92% of the whiskers represent a specific shape. The result of X-ray diffraction and electron beam diffraction is the same as in Embodiment 16. Zinc oxide is 99.96% by the atomic absorption analysis.

Embodiment 18

Zinc powders, 99.5% purity, are turned into gaseous state through gas spray with a burning flame of oxygen-liquefied natural gas, sprayed out 4 kg/hour into the air of 65% relative humidity. The powders are collected and left in 70% relative humidity for 3 days. Then, the powders are dried at 150° C. for 12 hours and baked in the same manner as in Embodiment 16. The baking temperature is 950° C. and baking time is 40 minutes. Accordingly, zinc oxide is generated in a dumpling state in the lower part of the crucible, while an aggregate of huge zinc oxide whiskers of a specific shape is formed in the upper part of the crucible with an apparent specific gravity 0.12. The aggregate is 81 wt % among the generated zinc oxide.

Figure 22:
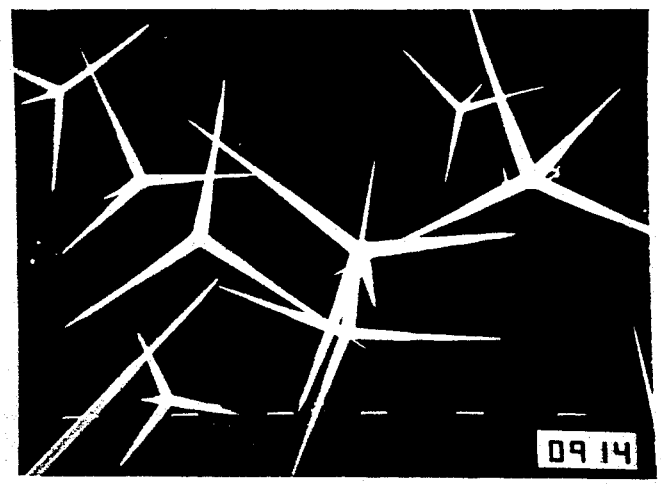

The obtained whiskers are seen in a photograph of FIG. 22 by an electron microscope. 91% whiskers are in a specific shape. The X-ray diffraction and electron beam diffraction result in the same as in Embodiment 16. Zinc oxide is 99.97% from the atomic absorption analysis.

Embodiment 19

Zinc powders, 99.2% purity, are flame-sprayed under the same conditions as in Embodiment 18. The powders are then left at 27° C. in 75% relative humidity for 12 days. Then, they are put in an ion exchange water by the ratio, 500 g powders to 400 g water, for subsequent stirring treatment by a mortar grinder for 10 minutes. Then, the powders are left in 30° C. water for 79 hours to mature. The water level is kept about 1 cm above the layer of powders and preserved in the air. Thereafter, the moisture is removed by drying the powders at 150° C. for 4 hours. The powders are then baked in the same manner as in Embodiment 16, except the baking temperature at 990° C. and baking time for 30 minutes. Thus, huge zinc oxide whiskers of an apparent specific gravity 0.11 are obtained 82 wt %. Zinc oxide in a dumpling state is found in the lower part of the crucible by the remaining wt %.

Figure 23:
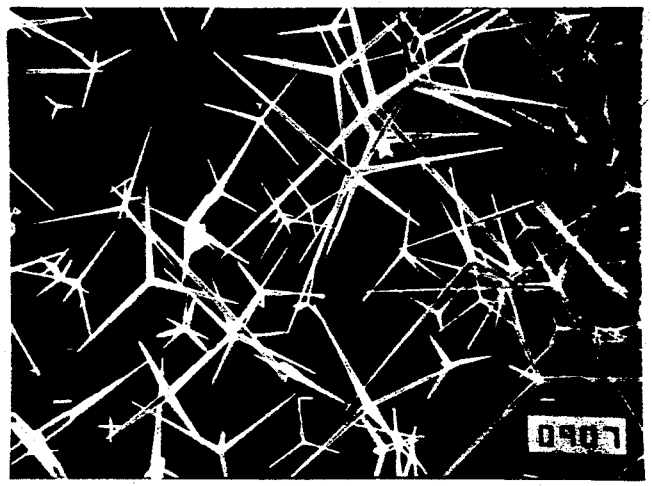

The whiskers are shown in FIG. 23 which is a photograph taken by an electron microscope. Whiskers of a specific shape are found 94 wt %. The result of the X-ray diffraction and electron-beam diffraction is the same as in Embodiment 16, and the atomic absorption analysis shows zinc oxide 99.97%.

Embodiment 20

Figure 24:
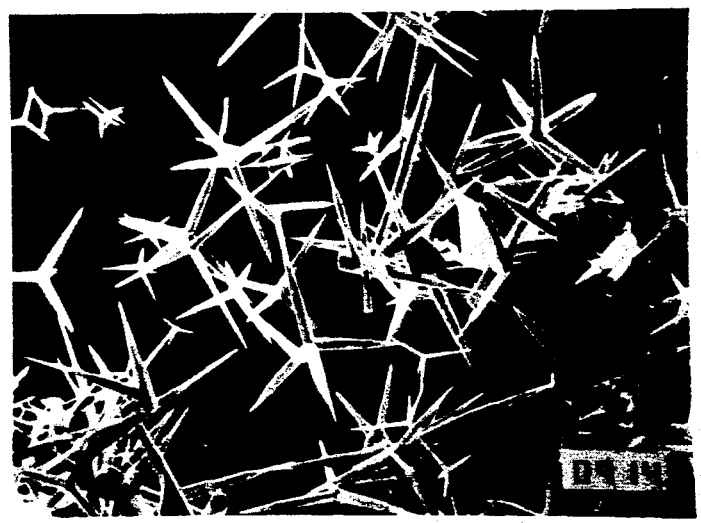

Zinc powders, 99.95% purity, are used and flame-sprayed through plasma jet. The powders are turned into gaseous state by a plasma flame of helium and jetted into the air of 67% relative humidity. The flame-spraying speed is 4 kg/hour. Then, the powders are left in the air of 65% relative humidity for 10 days, dried at 150° C. for 12 hours and baked in the same manner as in Embodiment 1. The powders are baked at 960° C. for 20 minutes. As a result, dumpling zinc oxide is formed in the lower part of the crucible, while an aggregate of huge zinc oxide whiskers having an apparent specific gravity 0.11 is formed in the upper part of the crucible. The ratio of the aggregate of whiskers to the generated zinc oxide is 85 wt %. The obtained whiskers are shown in FIG. 24 of a photograph by an electron microscope. 92% of the whiskers are formed in a specific shape. The X-ray diffraction and electron beam diffraction show the same result as in Embodiment 16. The atomic absorption diffraction shows zinc oxide 99.97%.

Embodiment 21

Under the same conditions as in Embodiment 20, zinc powders are flame-sprayed and collected, which are in turn left in 71% relative humidity for 10 days. The powders are put in an ion exchange water by the ratio, 1700 g powders to 500 g ion exchange water, stirred by a mortar grinder for 20 minutes, left in 31° C. water for 77 hours to mature. At this time, the water level is maintained about 1 cm above the layer of powders, and preserved in the air. Thereafter, the powders are dried for 7 hours at 150° C., and baked in the same manner as in Embodiment 16, but the baking temperature is kept 985° C. for 35 minutes.

Accordingly, huge whiskers of a specific shape with an apparent specific gravity 0.09 are obtained 80 wt %. The dumpling zinc oxide is gained 20 wt % in the lower part of the crucible.

Figure 25:
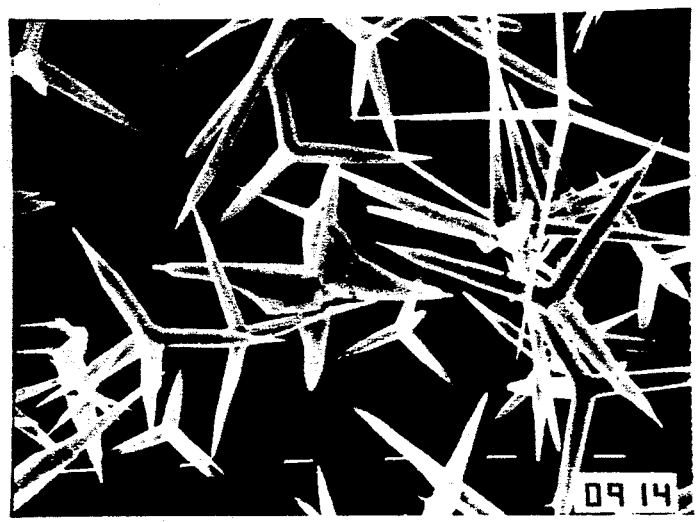

FIG. 25 shows the obtained whiskers by a photograph of an electron microscope. The X-ray diffraction and electron beam diffraction show the same result as in Embodiment 16. The atomic absorption analysis shows zinc oxide 99.99%. The foregoing Embodiments 16-21 are tabulated in Table 4.

Embodiment 22

Figure 26:
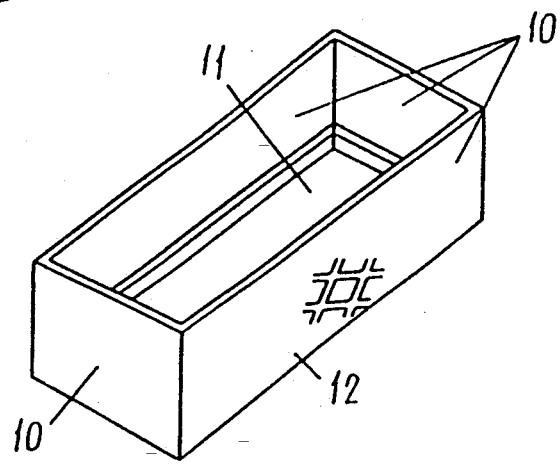
FIG. 26 is a perspective view of a crucible formed of material of a high numerical aperture employed in the embodiments of the present invention.

A crucible shown in FIG. 26 is used. The crucible is 150-280 mm wide, 250-350 mm long and 130-180 mm deep, made of corrosion-resistant stainless steel expanded metal not containing nickel with 20% or higher numerical aperture. According to this Embodiment, the corrosion-resistant stainless steel is composed of 18.6% chromium, 2.4% aluminum and the remaining iron. A bottom of the crucible is made of the same material as described above, 10-20 mm smaller both in width and length as compared with the side walls of the crucible, and 10 mm high. That is, the crucible is a non-porous box consisted of five faces. 80-120 g zinc powders coated with the oxide film are uniformly scattered on the bottom of the high numerical aperture crucible, brought into a muffle furnace and heated at 900°-1050° C. while the air is being supplied 2-4 g/min. from outside. The muffle furnace is 200-300 mm wide, 220-380 mm long and 200-300 mm high by inside measurement.

Figure 27:
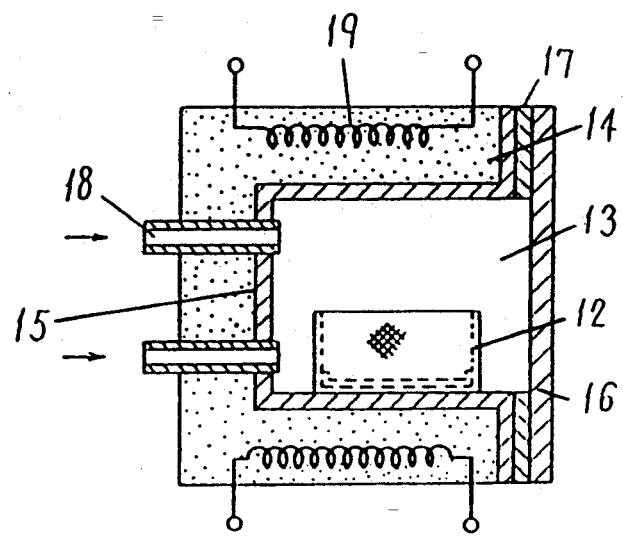
FIG. 27 is a sectional view showing the state when the crucible of FIG. 26 is placed in a muffle furnace.

The muffle furnace employed here is constructed as indicated in FIG. 27, which is provided with a metallic muffle 15 having no gas permeability inside a porous wall 14, thereby to assure air-tightness inside the furnace by a sealing material 17 intervened between the muffle 15 and a door 16. Numeral 18 is an inlet of the air, and numeral 19 is a heater.

Figure 28:
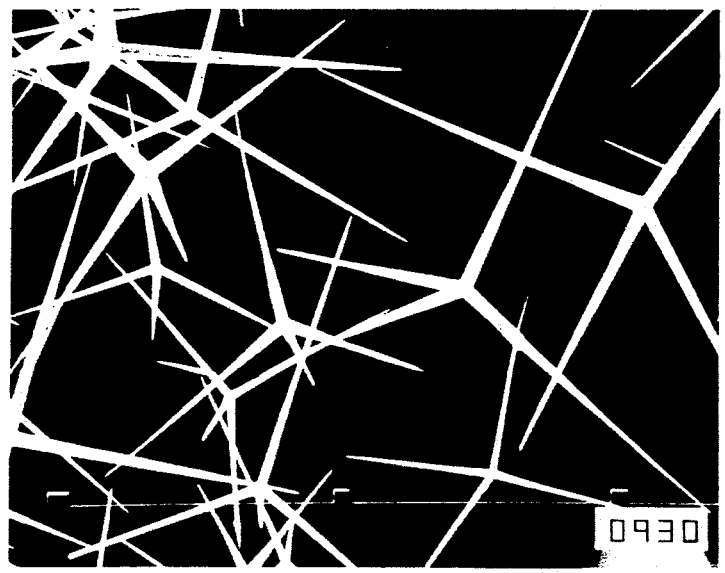
FIG. 28 is a photograph taken by an electron microscope showing the crystal structure obtained when the crucible of a high numerical aperture is used.

After the powders are heated for 20 minutes, the crucible is taken out from the muffle furnace. Zinc oxide whiskers of huge crystals as indicated in an electron microscopic photograph of FIG. 28 are obtained 85 wt % in the crucible, with yellow particles of zinc generated in a dumpling state by the remaining wt %. 95% or more of the whiskers are in a specific shape. The acicular parts of the whiskers is 3-250 tm long and 0.2-1.5 tm wide in correspondence to the temperature in the furnace and the amount of the air supplied from outside.

When the crucible is formed of wire mesh or punching board of the same material in place of the expanded metal, and the bottom of the crucible is made of porous porcelain containing alumina 90% and not allowing zinc powders to pass through, the result is approximately the same as above.

Although the numerical aperture of the crucible is set not lower than 20%, it is better to set the numerical aperture not higher than 60% in order to reduce the amount of generated substance overflowing outside the crucible.

Figure 29:
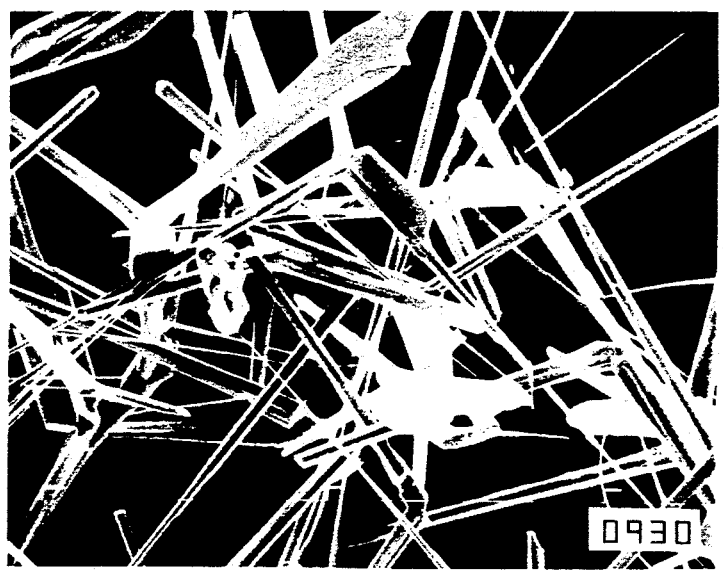
FIG. 29 is a photograph taken by an electron microscope showing the crystal structure of zinc oxide whiskers obtained by the use of a crucible made of corrosion-resistant stainless steel plate with 0 numerical aperture.

Meanwhile, when the side walls and bottom of the crucible are formed of non-porous corrosion-resistant stainless steel plate not containing nickel in the same size as indicated in FIG. 26, the generated substance in the crucible after baking is zinc oxide whiskers of a specific shape composed of crystalline bodies in the surface are of the crucible. However, zinc oxide generated in the lower part of the crucible close to the bottom thereof is plate-like and irregular as indicated in FIG. 29. Only 67 wt % of the generated substance is zinc oxide whiskers, and 75% of the whiskers is in a specific shape. However, the zinc oxide is generated inside the crucible with high yield, which means therefore this method is practical.

On the contrary, when the crucible has the numerical aperture not higher than 20%, the result is similar to that when the above alumina crucible is used. Furthermore, the opening of the crucible is clogged by the generated substance after it is heated several times, resulting in a non-porous container. When the numerical aperture is 60% or higher, the generated whiskers overflow outside the crucible, so that it takes a great deal of efforts to accommodate the generated whiskers in the crucible.

When the side walls and bottom of the crucible are formed of corrosion-resistant stainless steel containing nickel, namely, composed of 13.5% chromium, 8.0% nickel and the rest of iron, zinc powders react with nickel during the heating process, thereby causing a large thermal distortion, metallic cracks or metallic corrosion to the crucible members. Therefore, the crucible is not fit for practical use.

Table 5 shows kinds of the crucible and the ratio of zinc oxide whiskers to the generated substance obtained in respective crucibles.

Embodiment 23

Figure 30:
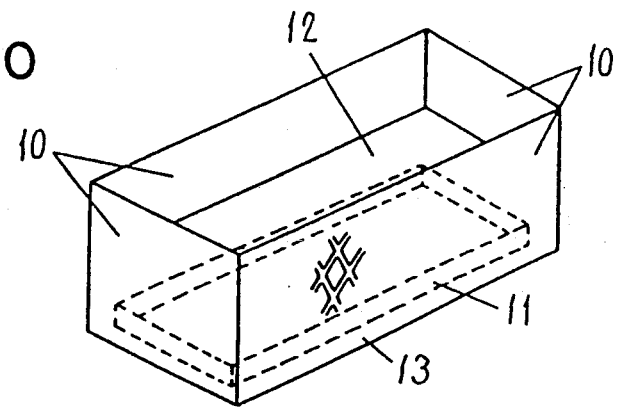
FIG. 30 is a perspective view of a crucible of a high numerical aperture provided with a partition plate employed in the embodiments of the present invention.
Figure 31:
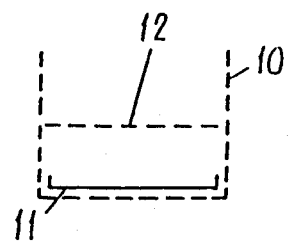
FIG. 31 is a schematic longitudinal sectional view of the crucible of FIG. 30.

A crucible shown in FIGS. 30 and 31 is used. Each side surface 10 of the crucible is 150-280 mm wide, 250-350 mm long and 130-180 mm high, made of corrosion-resistant stainless steel expanded metal not containing nickel with 20-60% numerical aperture. The crucible is provided with a partition plate 12 at a height half of the side surfaces. The partition plate 12 is also made of corrosion-resistant stainless steel expanded metal not containing nickel. The above-mentioned corrosion-resistant stainless steel contains, according to this Embodiment, 18.5% chromium, 2.4% aluminum and iron the rest. A bottom of the crucible is made of the same material as the side surfaces 10, and 10-20 mm smaller in width and length, with 10 mm height. The crucible is thus formed of four side faces 10 and the bottom face into a box with 0 numerical aperture.

80-120 g zinc powders with the oxide film are scattered uniformly on the bottom of the crucible and put in a muffle furnace 14, 200-300 mm wide, 220-380 mm long and 200-300 mm deep by inside measurement, and heated at 900°-1050° C. while the air is supplied 2-4 g/min. from outside.

Figure 32:
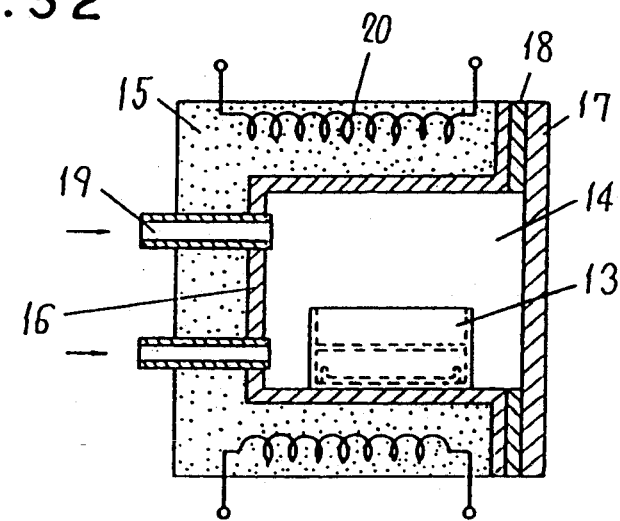
FIG. 32 is a sectional view showing the state when the crucible of FIG. 30 is placed in a muffle furnace.

The muffle furnace 14 used here and indicated in FIG. 32 is provided with a metallic muffle 16 inside a porous wall 15, wherein air-tightness is maintained by a sealing material 18 intervened between the muffle 16 and a door 17. Numeral 19 is an intake port of the air and numeral 20 is a heater.

Figure 34:
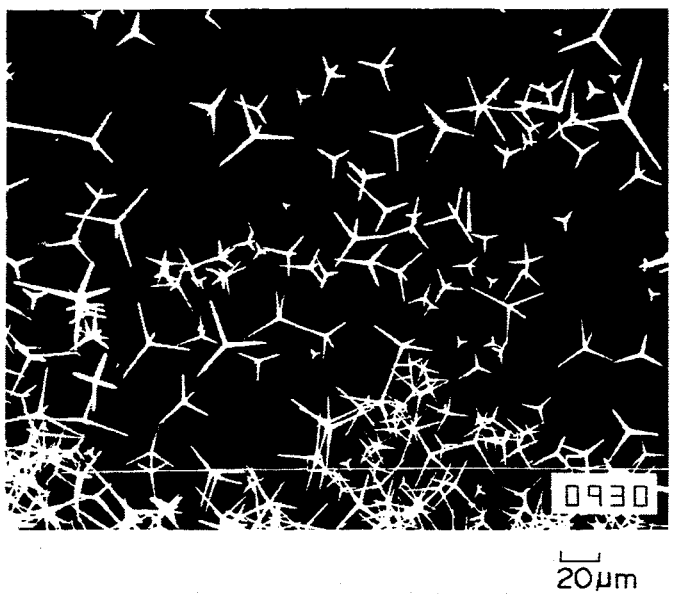
FIGS. 34-36 are photographs taken by an electron microscope showing the crystal structure of zinc oxide whiskers.

After heating for 20 minutes, the crucible is taken out from the furnace. In the area above the partition plate 12 (area A), 3-30 tm zinc oxide whiskers of a specific shape are generated, while in the area below the partition plate 12 (area B) 30-250 tm zinc oxide whiskers of a specific shape are formed, including several wt % of 3-30 tm whiskers. The zinc oxide whiskers generated in the area A are observed by an electron microscope and indicated in FIG. 34. As is apparent from FIG. 34, the generated substance is 100% zinc oxide whiskers of huge crystals which have the acicular parts, 3-30 tm long, mainly 20 tm long. Moreover, 95% of the generated zinc oxide whiskers are in a specific shape.

Figure 35:
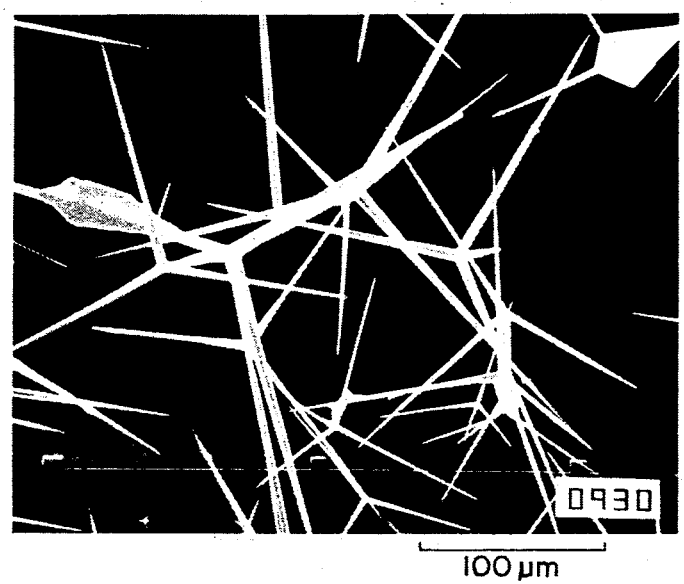

In the meantime, when zinc oxide whiskers generated in the area B are similarly observed by an electron microscope, 30-250 tm zinc oxide whiskers are there 80 wt % the total generated substance, including several % of 3-30 tm whiskers. The rest are dumpling particles of yellow zinc. 85% or more of the zinc oxide whiskers are in a specific shape. The oxide whiskers in the areas A and B are respectively shown in FIGS. 34 and 35.

Embodiment 24

Figure 33:
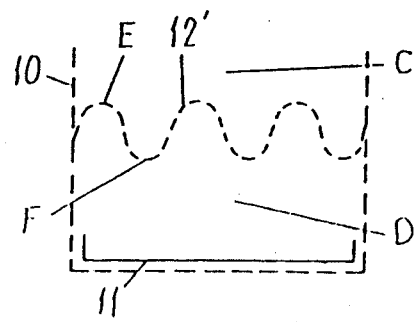
FIG. 33 is a schematic longitudinal sectional view of a modified crucible.

As shown in FIG. 33, a partition plate is made a partition wall 12', 50-60 mm pitch and 40-50 mm wave height. When the zinc powders in this corrugated crucible are subjected to heating treatment, zinc oxide whiskers are hardly formed in a ridge (area E) above the partition plate (area C), but intensively formed in a valley (area F). Naturally, zinc oxide whiskers generated in an area below the partition plate (area D) take the air from the area E, so that the zinc oxide whiskers in a specific shape are generated at a higher ratio in the area D than in the foregoing Embodiment, as is shown in FIG. 7.

In other words, the generated substance in the area C is 100% zinc oxide whiskers of huge crystals, with the acicular parts, 3-30 tm long, mainly 20 tm long. Further, 95 wt % of the generated zinc oxide whiskers are in a specific shape, identical to the zinc oxide whiskers generated in the area A above the flat partition plate.

Figure 36:
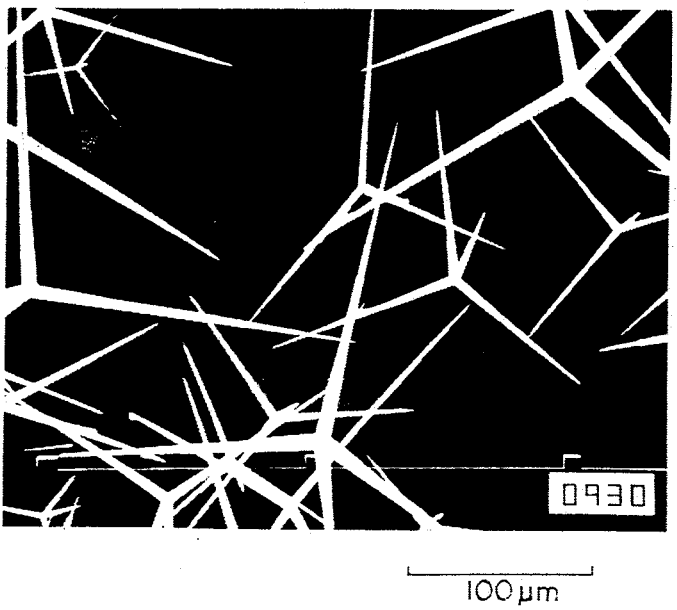

As seen from FIG. 36, 85 wt % is zinc oxide whiskers in the area D, 94% of which are in a specific shape.

Comparative example 5

A crucible of the same size and the same material as indicated in FIG. 30 which has side walls and bottom face formed of corrosion-resistant stainless steel plate not containing nickel is used to heat the powders. The generated substance in the surface area of the crucible is the same as obtained in the crucible of a high numerical aperture without a partition plate. However, more and more zinc oxide is generated irregularly or in plate-like crystals at a lower part of the crucible, namely, in the area closer to the bottom. Zinc oxide whiskers are obtained only 67 wt %, and 75% of the generated zinc oxide whiskers are in a specific shape. The acicular part of the whiskers has the length in a wide range from 3 to 250 tm.

Comparative example 6

A crucible made of corrosion-resistant stainless steel plate not containing nickel as in Comparative example 5 is provided with a flat partition plate with a high numerical aperture and a corrugated partition plate. When zinc powders are heated in the crucible, zinc oxide whiskers formed above the partition plates are 3-30 tm whiskers in a specific shape at the surface area of the crucible. However, since the oxygen is not sufficient in the area close to above the partition plate and thereunder, zinc oxide whiskers of a specific shape are formed 40 wt % or less.

Comparative example 7

Even when the side walls of the crucible are formed of members having a high numerical aperture, if the numerical aperture is not higher than 20%, zinc oxide whiskers of huge crystals are generated 82 wt % to the whole generated substance as is the case when the ceramic crucible is used. Among the generated zinc oxide whiskers, 88% are in a specific shape.

When the crucible having 20% numerical aperture is provided with a flat partition plate with a high numerical aperture and a corrugated partition plate, zinc powders are not supplied with enough oxygen in the area close to above the partition plate and below the partition plate as in Comparative example 2, and therefore zinc oxide whiskers of a specific shape are obtained only 48 wt %. This method is accordingly not suitable for practical use.

Comparative example 8

If side walls of the crucible have 60% or higher numerical aperture, generated zinc oxide whiskers pop out from the crucible whether the partition plate is provided or not. Therefore, it is difficult to accommodate the generated substance in the crucible.

Comparative example 9

A crucible is formed of corrosion-resistant stainless steel composed of 18.5% chromium, 8.0% nickel and iron the rest. When zinc powders are put in the crucible and heated, they react with nickel, whereby a great thermal distortion, metallic cracks and metallic corrosion are brought about to the crucible. The crucible cannot stand practical use.

Embodiments 23 and 24 and Comparative examples 5-9 are tabulated in Table 6.

Embodiment 25

A reaction tube made of quartz is provided in a general furnace of siliconite tube type. The opposite ends of the reaction tube are sealed by branched fitting caps, thus forming a baking furnace to obtain zinc oxide whiskers. Necessary atmospheric gas is sent into the reaction tube from one upper pipe, and discharged out from the other branch pipe, so that the atmosphere in the reaction tube can be exchanged. The branch pipe at the discharge side is connected to a U tube which is a manometer and, a water bubbler via a Teflon tube. The atmospheric gas discharged from the reaction tube is arranged to be discharged outside the reaction system (outside the furnace) while bubbling in the water. The water bubbler is provided so as to confirm the circulation of the atmospheric gas in the tube, and also seal the water at the discharge side when the atmosphere is fixed (rendered static). At this time, the absorbed amount (reducing amount) of components of the atmospheric gas consequent to the reaction inside the tube is utilized so as to instruct pressure reduction through the water level of the manometer with the use of a reverse flow of the water in the bubbler.

Meanwhile, a ship-bottom shaped boat made of quartz is placed in the reaction tube. Measured zinc powders are put in the boat, whereby a reaction bed is completed.

The reaction actually proceeds in the manner as follows. In the first place, zinc powders which are measured are brought into the boat which is in turn temporarily placed at an end part of the reaction tube. At this time, the reaction tube is long enough to reach outside the heating zone of the tube furnace, and the end part of the reaction tube where the boat with powders is placed is sufficiently separated away from the heating zone of the tube furnace. Accordingly, in this state, zinc powders are hardly influenced thermally by the heat of the furnace. Even when the heating zone in the furnace is heated to a high temperature necessary for reaction, the boat is controlled not higher than 200° C. or lower. During the general circulation of the atmosphere, the boat is placed at the end part upstream of the atmospheric gas flow in the reaction tube, so that the temperature there is further lower. The opposite ends of the reaction tube are sealed respectively by a cap. A branch pipe of the cap at the side where the boat is placed is connected to a mixing bottle of gas through a Teflon tube, and the mixing bottle is further connected to a high pressure Bombe of oxygen and nitrogen. A branch pipe of the cap at the discharge side is connected to the manometer and water bubbler. Then, the flow of oxygen gas and nitrogen gas is respectively adjusted to compose necessary atmosphere. The atmosphere is sent to the reaction tube. The concentration of oxygen in the composed atmospheric gas is measured by an oxygen sensor by introducing a part of the oxygen discharged from the water bubbler.

Subsequently, the reaction tube is heated up to a temperature sufficient for evaporation of zinc metal (800°-1000° C.). After it is confirmed that the heating zone in the reaction tube reaches a balancing temperature, a push rod is inserted from another branch pipe provided in the cap of the reaction tube, thereby to move at once the boat to the heating zone. Immediately thereafter, a connecting tube at the entrance side of the atmospheric gas is closed by a pinch cock so that the atmosphere in the reaction tube is fixed (rendered static). Then, the zinc powders in the boat sent to the heating zone of the reaction tube are heated to an evaporating temperature or higher all at once, thereby generating zinc steam to fill the reaction tube, and at the same time, reacting with the oxygen in the atmospheric gas. As a result, white zinc oxide powders are generated in the boat and within the reaction tube in several minutes. At this time, the water is reversed to the circulation side from the water bubbler connected outside the furnace and flows into the U-shaped manometer. When it is confirmed that the water is rendered stable at a balancing position, it is measured so as to find the reducing amount of pressure in the reaction tube. The reducing amount in the reaction tube corresponds to the pressure reduction of the partial pressure of oxygen in the atmosphere as a result of the reaction between the zinc metal and oxygen in the atmosphere. Accordingly, the oxygen amount contributing to the reaction is calculated.

The zinc oxide powders formed in the reaction tube are taken out therefrom. The zinc oxide powders monitored by a scanning electron microscope appear to be a pulverulent body in a specific shape. The size and distribution of the size are measured Although a little amount of yellow white pulverulent bodies are generated at the bottom of the boat, the pulverulent bodies there do not represent a specific shape when monitored through a scanning electron microscope, but an aggregate of granular crystals in a dumpling state.

Figure 37:
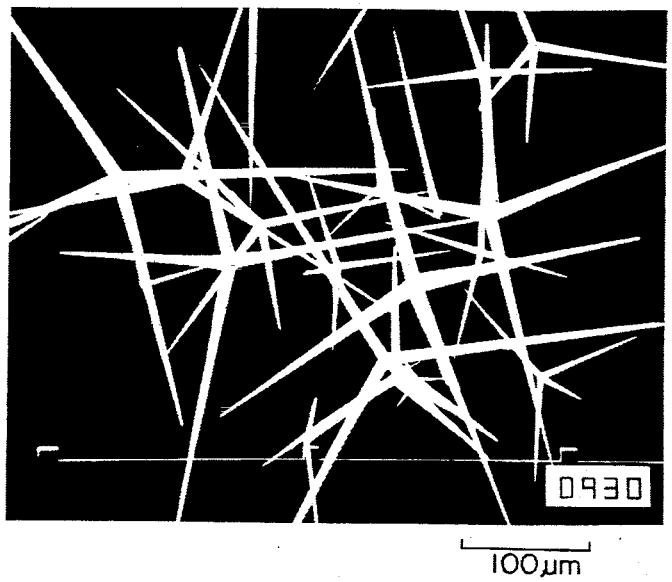
FIGS. 37-39 are photographs taken by an electron microscope showing the crystal structure of zinc oxide obtained under respective different conditions.
Figure 38:
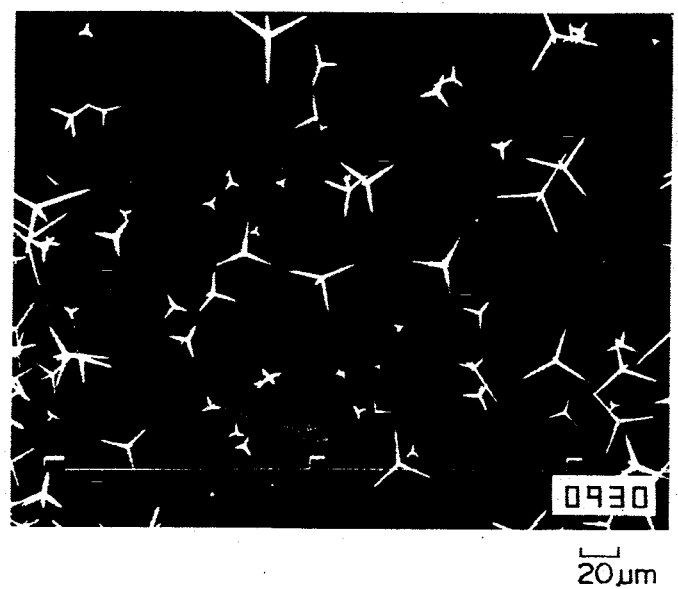
Figure 39:
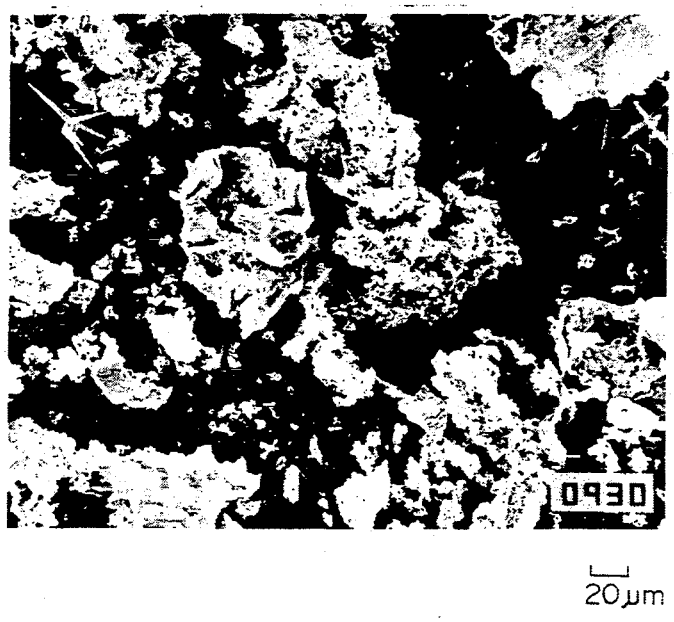

In producing zinc oxide crystals in a specific shape according to this embodiment, while the amount of zinc powders is constant, the concentration of oxygen in the atmosphere in the reaction tube before reaction is variously changed as indicated in Table 7. The yield of zinc oxide of a specific shape (the amount of zinc oxide powders of a specific shape to the supplied amount of zinc metal indicated by a percentage), the maximum and minimum values in the distribution of size of a generated crystal in a specific shape indicated by the distribution of length of an acicular part of the crystal in a specific shape (length from a base of the crystal to a tip of the acicular part), central value of the whole distribution and the concentration of oxygen in the atmosphere immediately after the reaction are also indicated in Table 7. A typical large whisker of a specific shape and a typical small whisker of a specific shape are respectively shown in FIGS. 37 and 38, and a typical granular crystal not formed in a specific shape is indicated in FIG. 39.

Embodiment 26

The same reaction system as in Embodiment 25 is used. The reaction procedure is as follows. Specifically, zinc metal powders which are measured are placed in a boat of quartz which is in turn placed at an end part of the reaction tube. Thereafter, both ends of the reaction tube are sealed by respective caps. Then, an atmospheric gas composed of oxygen of a predetermined concentration is supplied. After the concentration of oxygen in the atmospheric gas in the reaction tube is stabilized, the reaction furnace is heated. When the temperature of a heating zone in the reaction tube is turned into a balancing state, supply of the atmospheric gas is stopped. After a predetermined time later, the atmospheric gas composed of oxygen of a predetermined concentration is again circulated to continue the reaction. Zinc oxide powders generated in the reaction tube are taken out after the reaction to see the shape thereof.

Table 8 shows the concentration of oxygen in the circulating atmosphere before reaction, the time while the circulation of the atmospheric gas is stopped, the concentration of oxygen in the re-circulating atmosphere, and the shape of whiskers obtained under respective conditions.

Embodiment 27

The same reaction system as in Embodiment 25 is employed. The reaction procedure and condition are as follows. Measured zinc powders are put in a boat made of quartz and placed at an end part of the reaction tube. Then, the opposite ends of the reaction tube are sealed by caps. The air is fed into the reaction tube, so that the atmosphere in the reaction tube is made the atmospheric air. Influences on the formation of whiskers when the supplying amount (supplying speed) of the air is changed ar detected. The circulation of the atmosphere is made in two ways, namely, in one way, the atmosphere is rendered a static atmosphere in the early stage of the reaction (the circulation thereof is stopped) and then supplied again as in Embodiment 2, and in another way, the atmosphere is circulated in a stationary state from the start to the end of reaction. The result is shown in Table 9.

Embodiment 28

A main reaction tube made of a heat-proof inorganic fiber is coaxially provided in a hollow of a reaction tube made of quartz. The main reaction tube has a smaller diameter than the quartz tube. One end of the main reaction tube (at the side downstream of the atmospheric gas) is sealed by a member of the same material as the main reaction tube, while the other end is provided with a cap made of the same material as a lid. Both ends of the outer reaction tube are constructed in the same manner as in Embodiment 1, connected with the same additional tools. Although the reaction procedure proceeds approximately in the same manner as in Embodiment 26, the quartz boat with zinc powders is placed at an end part of the main reaction tube after the caps of the outer reaction tube are removed and also the cap of the main reaction tube is detached. Thereafter, a nitrogen balance gas having the concentration of oxygen adjusted is circulated in the outer reaction tube. When it is confirmed that the temperature of the heating zone in the main reaction tube reaches balancing temperature, the boat is pushed to the heating zone from outside by a push rod, and the end of the main reaction tube is sealed by the cap immediately.

At this time, the concentration of oxygen circulating in an outer periphery of the main reaction tube is changed. The yield and shape of the generated whiskers are shown in Table 10.

Embodiment 29

An inner box (muffle) made of heat-proof steel is placed in a general box electric furnace. The muffle is opened at the front surface only (at the side of a door of the furnace). Fresh air (atmospheric gas) is supplied from outside the furnace through a pipe welded to an opposite surface to the opening surface of the muffle. The opening surface of the muffle is provided with a flange made of steel around a peripheral part thereof, and a heat-proof seal made of heat-proof non-woven fabric is attached to the whole periphery of the flange, so that the door of the muffle can be closed in tight contact with an inner surface of the furnace door. The atmosphere is not allowed to permeate by a slight difference of the pressure inside and outside the muffle because of the heat-proof seal. However, it can be discharged when pressure is increased within the muffle (increase of pressure subsequent to the in-flow of fresh gas from outside). Therefore, in a normal state, the muffle furnace is a so-called circulating furnace which is able to control the atmosphere, similar to Embodiments 26 and 27. Zinc metal powders are scattered on the bottom of a corrosion-resistant saucer into a uniform thickness. After the concentration of oxygen and temperature of the atmosphere inside the muffle become stable, the door is opened to insert the saucer in the muffle, then the door is shut promptly. When the atmosphere in the muffle is set the same as in Embodiments 26–27, the yield and distribution of shape of the generated whiskers are approximately identical to those in Embodiments 26–27.

Embodiment 30

A porous box-shaped electric furnace having wall members made of heat-proof inorganic fibrous substance is used (however, an outer casing is made of steel, so that the air is filled in a gap between the porous box and the outer casing). Such steel muffle as employed in Embodiment 28 is not used. Moreover, no opening or tube for insertion of fresh air into the furnace is provided. The reaction procedure is the same as in Embodiment 29. Only the supplying amount of zinc metal powders is changed. The atmosphere in the furnace is changed through natural ventilation via the wall members. It is confirmed that the ventilation through the wall members is effected because the oxygen is consumed by the oxidization reaction of zinc metal powders thereby to cause a pressure reduction inside the furnace which results in a pressure difference inside and outside the furnace, whereby the air outside the furnace is taken into the furnace through the porous wall members. The yield to the supplying amount of zinc metal powders and the shape of generated whiskers are tabulated in Table 11. The supplying amount of zinc powders are indicated per a capacity of the furnace.

Embodiment 31

The same reaction system as used in Embodiment 25 is employed here. First of all, empty boat of quartz without powders is placed in the center of the heating zone of the reaction tube, and the both ends of the reaction tube are sealed by caps. Then, the atmospheric gas is sent into the reaction tube for circulation. In the meantime, the cap at the upstream side is provided with a branch pipe, through which a straight pipe of quartz reaches immediately above the boat placed in the center of the heating zone of the reaction tube. The straight pipe extends its other end far from outside the reaction tube. Moreover, a T-shaped branch pipe is connected to the other end of the straight pipe. An opening in a direction of the center line of the straight pipe is directly connected to a nitrogen gas Bombe via a flow meter, while an opening directed upwards in a vertical direction to the center line is connected to a storing bottle of zinc metal powders. When the temperature in the heating zone in the reaction tube is stabilized, a nitrogen gas is supplied to a supply pipe of powders thereby to feed zinc powders from the storing bottle to the supply pipe by a predetermined amount. The zinc powders are allowed to ride on the flow of the nitrogen gas, continuously falling down onto the boat in the reaction tube. The generating yield of whiskers and distribution of shape of zinc oxide crystals in a specific shape vary depending on the concentration of oxygen in the atmosphere, circulating amount of atmosphere and feeding speed of zinc powders during the reaction. Although these factors bring about influences similar to those in Embodiment 27, as a whole, whiskers of a smaller size tend to be generated.

Embodiment 32

A nitrogen flow curtain is provided at opposite ends of an electric furnace, that is, a tunnel muffle made of general heat-proof and corrosion-resistant material (for example, porcelain, inconel) so as to prevent the air from entering the muffle. Moreover, a supply port and a discharge port for component gas of the atmosphere are formed at a suitable position so a to control the atmosphere in the muffle. The supply port is connected to a discharge unit for discharging composed atmosphere, while the discharge port is connected to a discharge pipe which is arranged not to diffuse the air in a reverse direction. A chain conveyor or a belt conveyor is placed at the bottom surface of the muffle. The conveyor is also made of heat-proof and corrosion-resistant material, which is driven by a device provided outside the muffle furnace. Zinc oxide whiskers are manufactured in the tunnel furnace as follows.

When the composed atmospheric gas is introduced into the furnace so that the atmosphere in the furnace is in a predetermined composition of components, the electric furnace is made conductive to heat the muffle. It should be confirmed when the temperature of the atmosphere in the furnace is raised to a predetermined temperature. A predetermined amount of zinc powders are scattered in a uniform thickness on the bottom of a plurality of saucers each made of heat-proof and corrosion-resistant material and then, the saucers are aligned at a front part of the conveyor in front of an entrance of the tunnel furnace. Then, the conveyor is driven at a set speed, so that the saucers are sequentially transferred into the furnace. The conveyor is driven at this time at such adjusted speed as to keep one saucer within the furnace until all the zinc powders in the one saucer are completely changed to zinc oxide. The components of the atmosphere in the furnace are approximately the same as in Embodiment, and the composition thereof is arranged to correspond to that in Embodiment 27 while the total amount of powders in the tunnel furnace is made corresponding to the supply amount of zinc powders in Embodiment 27. It is needless to say that the amount of zinc powders in the furnace is gradually increased since the first saucer is introduced into the furnace until many saucers enter to occupy the whole area of the furnace. Therefore, the composition of the atmospheric gas should be changed in accordance with a preset program. Once the whole area of the furnace is occupied by the saucers, the composition of the atmosphere is made constant although fresh saucers are continuously introduced from the entrance. For the reaction under the conditions of Embodiment 25 or 26, the saucers should be intermittently transferred. In other words, the air in the furnace is exchanged with fresh air immediately before one saucer enters the furnace. After the total zinc powders in the saucer are turned to zinc oxide, the saucer is discharged from the furnace and simultaneously with this, the atmosphere in the furnace is discharged. This cycle is intermittently repeated. Zinc oxide whiskers in a specific shape generated in this method represent similar shape and distribution of shape to those in Embodiments 25, 26 and 27. If the manufacturing conditions (temperature, composition of the atmosphere, circulating speed of the atmosphere, driving speed of the conveyor, supply amount of zinc metal, etc.) are correctly maintained, it is possible to obtain a great amount of zinc oxide whiskers in a specific shape.

Furthermore, if the muffle is made of the porous material as employed in Embodiments 28–30 and further enclosed with a non-porous material thereoutside, that is, if the muffle is a double muffle, a continuous muffle can be achieved, showing the same result as in Embodiments 28–30. Since the fresh air is automatically supplied from outside through the wall members of the muffle in correspondence to the reaction amount of powders in the furnace, it is conveniently not necessary to control the atmosphere when the whole area of the furnace is not occupied by the powders.

Embodiment 33

A siliconite tube furnace of a general model is provided with a reaction tube made of quartz, and the opposite ends of the reaction tube are sealed by branched fitting caps, thereby forming a baking furnace to obtain zinc oxide whiskers. A necessary atmospheric gas is sent into the reaction tube from one branch pipe, and the atmosphere in the tube is discharged from the other branch pipe, so that the atmosphere is exchanged. The branch tube at the discharge side is connected to a U tube which is a manometer and a water bubbler via a Teflon tube. The atmospheric gas discharged from the reaction tube is let outside the reaction system (outside the furnace) while bubbling in the water. The water bubbler works not only to confirm the circulation of the atmospheric gas in the reaction tube, but to seal the water at the discharge side when the atmosphere is fixed (rendered static). Further, the water bubbler is useful to indicate the absorbing amount (reducing amount) subsequent to the reaction of components of the atmospheric gas in the reaction tube by the water level of the manometer with the use of the reverse flow of water.

Meanwhile, a ship-bottomed boat of quartz is used to place zinc powders therein, whereby a reaction bed is formed.

After zinc powders are measured and put in the boat, the boat is temporarily placed at one end of the reaction tube. At this time, the reaction tube is long enough to reach outside the heating zone of the tube furnace. The end of the reaction tube where the boat is placed is separated far from the heating zone of the furnace. Therefore, zinc powders in the boat are hardly influenced by the heat of the furnace. Even when the heating zone is heated to a high temperature necessary for reaction, the temperature of the boat is kept not higher than 200° C. During the general circulation of atmosphere, the boat is placed at an end part upstream of the gas flow in the reaction tube, and the temperature of the boat there is further lower. Then, in the state as above, both ends of the reaction tube are sealed by caps. Then, the atmosphere in the reaction tube which is composed of oxygen gas, carbon dioxide gas and nitrogen gas is led into the furnace. The flow of each gas is adjusted. The concentration of oxygen in the atmospheric gas is, after being discharged from the reaction tube, measured by an oxygen sensor by guiding a part thereof discharged out of the water bubbler. Moreover, the concentration of carbon dioxide is calculated from the ratio of the mixed gas flow. The reaction tube is then heated to a temperature sufficient to evaporate the zinc metal (800°-1200° C.). When the heating zone of the tube is confirmed to be a balancing temperature, the boat is moved to the heating zone by a push rod inserted from one branch pipe provided with the cap at the end of the reaction tube. Immediately thereafter, the connection tube at the entrance side of the atmospheric gas is closed by a pinch cock, so that the atmosphere in the reaction tube is fixed (rendered static). Consequently, the zinc metal in the boat moved to the heating zone is promptly heated over the evaporating temperature, with generating zinc steam to fill the reaction tube, and at the same time, it reacts with the oxygen in the atmospheric gas, thereby to form white zinc oxide powders in the boat and in the reaction tube in several minutes. At this time, the water is reversed to the upstream side from the water bubbler connected outside the furnace, and further enters the U-shaped manometer where it is measured to detect the reducing amount of pressure in the reaction tube after the water is stabilized in the balancing state. The reducing amount of pressure in the reaction tube corresponds to the reduction in the partial pressure of the oxygen in the atmosphere as a result of the reaction thereof with the zinc metal. Therefore, the oxygen amount contributing to the reaction can be calculated.

The zinc oxide powders generated in the reaction tube are taken out and monitored by a scanning electron microscope. It is confirmed that the zinc oxide powders are in a specific shape. The size and distribution of the shape are also measured. Simultaneously, a little amount of yellow white powders are generated at the bottom of the boat, but, the powders are not in a specific shape as observed by the scanning electron microscope, but an aggregate of granular crystals in a dumpling state.

Figure 40:
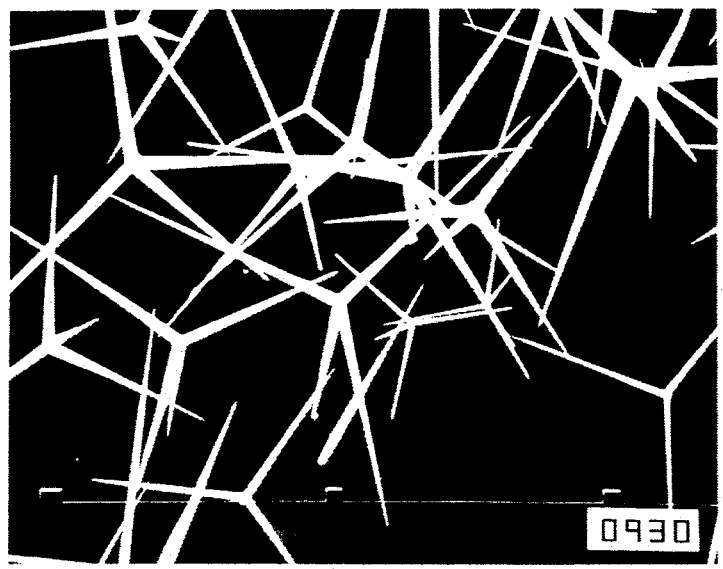
FIG. 40 is a photograph taken by an electron microscope showing the crystal structure of whiskers of a specific shape obtained in the embodiments of the present invention.
Figure 41:
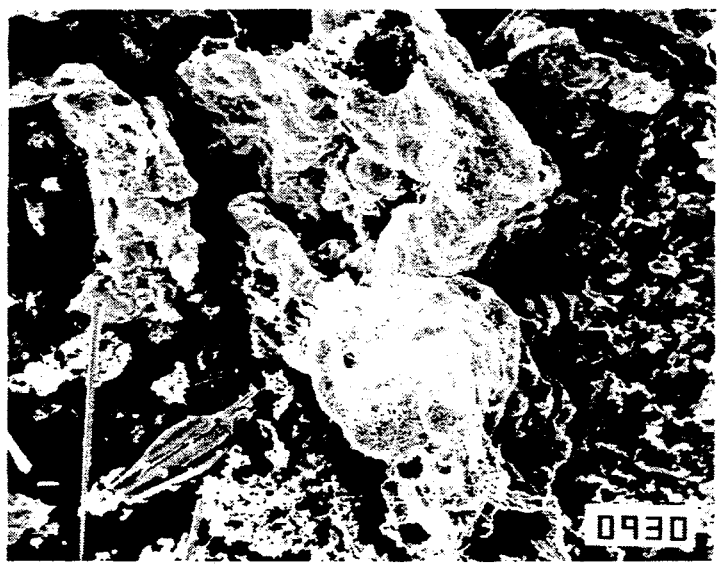
FIG. 41 is a photograph taken by an electron microscope showing the crystal structure of granular zinc oxide.

In this Embodiment 33, the concentration of oxygen and that of carbon dioxide in the atmosphere before reaction are changed as indicated in Table 12, while the amount of zinc powders is constant. Table 12 shows the yield of zinc oxide in a specific shape (indicated by a percentage of the amount of zinc oxide powders in a specific shape to the supply amount of zinc metal) generated under respective conditions of the concentration of oxygen and carbon dioxide, maximum and minimum values of the distribution of size of a generated crystal in a specific shape indicated by the contribution of length of an acicular part of the crystal in a specific shape (length from a base of a tetra to an end of the acicular part), central value of the whole distribution, half-value width of the whole distribution and the concentration of oxygen in the atmosphere immediately after the reaction. A typical whisker in a specific shape is indicated in FIG. 40 of a photograph taken by an electron microscope, and a typical granular crystal not in a specific shape is indicated in FIG. 41.

Embodiment 34

The same reaction system as in Embodiment 33 is used. The reaction procedure is changed. Specifically, zinc metal powders are measured and put in a boat of quartz. The boat is placed at an end of a reaction tube. Then, both ends of the reaction tube are sealed by caps. An atmospheric gas composed of oxygen and carbon dioxide each having a predetermined concentration is circulated. After the concentration of oxygen in the atmospheric gas in the reaction tube is stabilized, the reaction furnace is heated to turn the heating zone to a balancing state. The zinc powders are promptly inserted into the heating zone for reaction while the atmospheric gas is being circulated. After the reaction, zinc oxide powders generated in the reaction tube are taken out to see the shape thereof.

Each concentration of oxygen and carbon dioxide in the circulating atmosphere before reaction, circulating amount (circulating speed) of gas and the shape of generated whiskers under respective conditions are indicated in Table 13.

Embodiment 35

The reaction system is in the same structure as in Embodiment 33. An exit of the water bubbler is connected via a Teflon tube to a branch pipe of the cap at the side where the boat is placed. An inlet of the water bubbler is connected to a gas mixing bottle which is connected to high pressure Bombes of oxygen and nitrogen, and of carbon dioxide. The water bubbler is enclosed by a heating muffle which is adjusted in temperature. Further, a flow passage from the outlet of the bubbler to the cap of the reaction tube is normally heated to 150° C. or so by a ribbon heater. The atmospheric ga running out of the mixing bottle bubbles in the heated water to be a mixed gas containing saturated steam which then enters the reaction tube through the flow passage heated not lower than the condensing temperature of the gas. The ratio of moisture in the mixed gas (concentration of steam) is calculated from the pressure of saturated steam obtained by the temperature of the heated water bubbler (humidifier).

Reaction is practiced in the following manner. Zinc powders are measured and put in a boat of quartz. The boat is temporarily placed at an end of the reaction tube. While the humidifier is heated to a predetermined temperature, an atmosphere necessary for reaction is composed of oxygen gas and nitrogen gas and sent to the reaction tube. The flow of the oxygen gas and that of the nitrogen gas are adjusted. The concentration of oxygen in the atmospheric gas is measured by introducing a part of the oxygen discharged from the water bubbler to an oxygen sensor. Then, the reaction tube is heated to a temperature enough to evaporate zinc metal (800°-1200° C.). When the heating zone in the reaction tube becomes a balancing temperature, a push rod is inserted from another branch pipe provided with the cap at the end of the reaction tube thereby to move the boat to the heating zone. Immediately thereafter, a connection tube at the entrance side of the atmospheric gas is closed by a pinch cock, so that the atmosphere in the reaction tube is fixed (made static). Accordingly, zinc metal in the boat is heated to the evaporating temperature, thereby generating zinc steam suddenly to fill the reaction tube. At the same time, the zinc metal reacts with the oxygen in the atmospheric gas to produce white zinc oxide powders in the boat and reaction tube. The water runs in a reverse direction from the water bubbler to the upstream into the U-shaped manometer, where the reducing amount of pressure in the reaction tube is measured after it is confirmed that the water is stabilized in the balancing state. The reducing amount of pressure in the reaction tube is corresponding to the reduction in the partial pressure of oxygen in the atmosphere subsequent to the reaction thereof with zinc metal, and therefore the oxygen amount consumed in the reaction can be calculated.

After the produced zinc oxide powders are taken out from the reaction tube, they are monitored by a scanning electron microscope and found out to be composed of particles of crystalline bodies in a specific shape. The size and distribution of the shape are also measured.

Although a little amount of yellow white powders are generated at the bottom of the boat, these powders are not in a specific shape, but an aggregate of granular crystals in a dumpling state.

The concentration of oxygen and that of steam in the atmosphere before reaction are changed as shown in Table 14, with the amount of zinc powders kept constant, according to this embodiment. The yield of generated zinc oxide in a specific shape under respective conditions of concentration, maximum and minimum values of the distribution of size of a generated crystal in a specific shape indicated by the distribution of length of an acicular part of the crystal, central value of the whole distribution, half-value width of the whole distribution and the concentration of oxygen in the atmosphere immediately after reaction are indicated in Table 14.

Embodiment 36

A reaction system employed is the same as in Embodiment 35, but the reaction procedure is changed. Namely, zinc metal powders are measured and placed in a boat of quartz. The boat is placed at an end of a reaction tube. Both ends of the reaction tube are closed by caps, into which an atmospheric gas composed of oxygen and steam of a specific concentration is circulated. After the concentration of oxygen of the atmospheric gas in the reaction tube becomes stable, the reaction furnace is heated. When the temperature of the heating zone of the reaction tube is in a balancing state, the boat is promptly inserted to the heating zone for reaction of the zinc powders while the atmospheric gas is being circulated. After the reaction, zinc oxide powders generated in the reaction tube are taken out to see the shape thereof.

The concentration of oxygen and that of steam in the circulating atmosphere before reaction, and circulating amount (circulating speed) of the gas are tabulated in Table 15, as well as the shape of whiskers generated under respective conditions.

Embodiment 37

The reaction system is the same structure as in Embodiment 35. An exit of a water bubbler is connected via a Teflon tube to a branch pipe of the cap at the side where a boat is placed, with an inlet thereof being connected to a gas mixing bottle connected to high pressure Bombes of oxygen and nitrogen, and carbon dioxide.

In order to achieve reaction, zinc powders are measured and placed in a boat of quartz. The boat is temporarily placed at an end of the reaction tube. Then, for composing an atmosphere necessary for reaction, the flow of oxygen gas, carbon dioxide and nitrogen gas is respectively adjusted. While a humidifier is heated to a predetermined temperature, the oxygen gas, carbon dioxide and nitrogen gas are supplied into the reaction tube. The concentration of oxygen in the atmospheric gas is measured by introducing a part thereof discharged from the water bubbler after it flows out of the reaction tube. The reaction tube is then heated to a temperature sufficient to evaporate zinc metal (800°-1200° C.). When it is confirmed that the heating zone of the reaction tube is at a balancing temperature, the boat is immediately moved to the heating zone by a push rod inserted from another branch pipe provided with the cap at the end of the reaction tube. Immediately after this, a connecting tube at the entering side of the atmospheric gas is closed by a pinch cock, so that the atmosphere in the reaction tube is fixed (made static). Accordingly, the zinc metal in the boat inserted to the heating zone in the reaction tube is heated over the evaporating temperature all at once, thereby generating zinc steam which fills the reaction tube. Concurrently, the zinc metal promptly reacts with the oxygen in the atmospheric gas to generate white zinc oxide powders in the boat and reaction tube. At this time, water is reversed from the water bubbler to the upstream to the U-shaped manometer. The reducing amount of pressure in the reaction tube is measured by the manometer after it is confirmed that the water is stable at the balancing position. The reducing amount of pressure in the reaction tube corresponds to the reduction in the partial pressure of oxygen in the atmosphere due to the reaction thereof with zinc metal, and therefore the oxygen amount used for the reaction can be calculated.

Zinc oxide powders generated in the reaction tube by the foregoing reaction procedure are monitored by a scanning electron microscope and confirmed to be powders composed of crystals of a specific shape. The size and distribution of the shape are measured as well. Moreover, a little amount of yellow white powders are generated in the bottom of the boat. However, these powders do not show a specific shape, but are an aggregate of granular crystals in a dumpling state.

According to Embodiment 37, the amount of zinc powers is constant, whereas the concentration of oxygen and steam in the atmosphere in the reaction tube before reaction is changed as shown in Table 16. The yield of the zinc oxide generated in a specific shape under respective conditions of concentration, maximum and minimum values of the distribution of size of a crystal in a specific shape indicated by the distribution of length of an acicular part of the crystal in a specific shape, central value, half-value width and concentration of oxygen in the atmosphere immediately after reaction are all tabulated in the same Table 16.

Embodiment 38

The same reaction system as in Embodiment 37 is employed herein. The reaction procedure is as follows. That is, zinc metal powders after being measured are put in a boat of quartz which is in turn placed at an end of the reaction tube. Thereafter, both ends of the reaction tube are sealed by caps. An atmospheric gas composed of oxygen, carbon dioxide and steam each having a predetermined concentration is circulated. When the concentration of oxygen of the atmospheric gas in the reaction tube is stabilized, the reaction furnace is heated. After the heating zone of the reaction tube is brought to a balancing temperature, the boat is inserted promptly to the heating zone, so that the powders react with the circulating gas. The generated zinc oxide powders are taken out after the reaction to detect the shape thereof.

Table 17 indicates the concentration of oxygen in the circulating atmosphere before reaction, concentration of carbon dioxide, concentration of steam, circulating amount (circulating speed) of the gas and shape of generated whiskers under respective conditions.

Embodiment 39

A heat-proof steel inner box (muffle) is placed in a general box-like electric furnace. The inner box is opened only at a front surface thereof (at the side of a door of the furnace). An introducing pipe for fresh air (atmospheric gas) is welded to a rear surface opposite to the opening surface of the muffle so as to feed fresh air from outside the furnace. On the other hand, a steel flange is provided at a peripheral part of the opening, with a seal made of heat-proof non-woven fabric being attached to the whole periphery of the flange, whereby the muffle can be closed in tight contact with an inner surface of the furnace door. The air-tightness inside the muffle is so controlled as not to permit the air to pass through by a small pressure difference inside and outside the muffle, while allowing the air to flow outside by an increase of pressure inside the muffle (increase of pressure caused when the gas enters from the introducing pipe mentioned above). In the normal circulating state, therefore, the muffle furnace is considered as a so-called circulating furnace, enabling control of the atmosphere similar to that effected in Embodiments 33, 35 and 37. After the furnace is heated to a predetermined temperature, a composite gas composed of oxygen and carbon dioxide and nitrogen, concentration of which is respectively adjusted, is introduced from the introducing pipe. In the meantime, zinc metal powders are scattered uniformly in thickness on the bottom of a corrosion-resistant saucer. When the temperature of atmosphere in the furnace and the atmosphere in the furnace are both stabilized, the furnace door is opened to insert the saucer into the muffle, and promptly closed. Oxidization reaction occurs. The atmosphere in the furnace is set by changing the conditions in Embodiment 2 in correspondence to the supply amount of powders here. The yield and shape of the generated whiskers together with the distribution thereof are identical to those in Embodiment 2.

Embodiment 40

A reaction furnace is the same as employed in Embodiment 39. In addition, a humidifier able to be heated up to 150° C. is placed between the introducing pipe of fresh air and a composite gas mixer. A flow passage from the humidifier to the introducing pipe is heated to 200° C. When the furnace is heated to a preset temperature, a composite gas composed of oxygen, carbon dioxide and nitrogen having respectively a predetermined concentration is sent through the humidifier which is heated to a predetermined temperature. On the other hand, zinc metal powders are scattered on the bottom of a corrosion-resistant saucer uniformly. When the temperature of the atmosphere in the furnace and the atmosphere in the furnace are stabilized, the furnace door is opened to insert the saucer in the muffle, and closed promptly. The atmosphere in the furnace during the reaction is set by changing the conditions in Embodiment 36 in correspondence to the supply amount of zinc metal powders. The yield, shape and distribution of the generated whiskers are identical to those in Embodiment 35.

Embodiment 41

Although a reaction furnace is the same as employed in Embodiment 40, a gas to be circulated from the introducing pipe for an exchange of the atmosphere in the furnace is a burning gas of propane which is a hydrocarbon fuel. Therefore, a semi-sealed burner is added, which is connected to the introducing pipe to sent the burning gas into the furnace. The concentration of oxygen and carbon dioxide in the burning gas is adjusted by adjusting the fuel of the burner and the burning air. Then, the burning gas is sent to the furnace. Naturally, the concentration of steam is determined by the burning. In the meantime, zinc metal powders scattered uniformly on the bottom of a corrosion-resistant saucer are inserted into the muffle after the temperature of atmosphere and the atmosphere in the furnace become stable. Then, the furnace door is closed promptly for reaction. The atmosphere in the furnace at this time is set by changing the conditions in Embodiment 38 in compliance with the supply amount of the zinc powders. If the composition of the atmosphere is such that is difficult for the reaction to occur only by burning, necessary components (oxygen, carbon dioxide and steam) are added to the burning gas from high pressure Bombes. The yield, shape and distribution of whiskers are identical to those in Embodiment 38.

As is apparent from the foregoing description of Embodiments, the manufacturing method of the present invention realizes zinc oxide whiskers in a huge specific shape. According to one method of the present invention which corresponds to Embodiments 1-6, metallic zinc powders are adjusted, mechanically pulverized and ground in coexistence with water, matured in the water and dried, and thereafter the baking process is carried out in the atmosphere containing oxygen after the zinc powders are scattered on the bottom of the container. Thus, zinc oxide whiskers of a specific shape are obtained in various sizes depending on the conditions.

According to one method of the present invention corresponding to Embodiments 7-12, a particle size of metallic zinc powders is selected, a sealing oxide film is adjusted, mechanical grinding and maturing of powders are effected in water thereby to increase the thickness of the oxide film with improving the sealing property thereof. Subsequently, the powders are dried and baked. According to this method, zinc oxide whiskers of a specific shape in various sizes are obtained depending on the conditions.

According to one method of the present invention corresponding to Embodiments 13-15, metallic zinc powders are adjusted, mechanically ground in coexistence with water, matured in the water, dried and mixed with ceramic powders for subsequent baking process. By setting the conditions, zinc oxide whiskers of a specific shape having various sizes are obtained.

Further, according to one method of the present invention corresponding to Embodiments 16-21, metallic zinc powders are prepared through gas flame-spray or plasma jet, mechanically ground in coexistence with water, matured in the water, dried and baked. Zinc oxide whiskers of various sizes are generated in a specific shape depending on conditions.

As one advantage of the present invention, oxygen can be smoothly supplied into the crucible which is the center of solid-liquid-gas reaction field, to match with the temperature of zinc steam accompanying a secular change, as is described in conjunction with Embodiment 22. The supply amount of oxygen into the crucible can be controlled in correspondence to a low concentration of zinc steam at the start and finish of reaction, and also to a high concentration thereof at the middle of reaction.

When an alumina crucible is employed to heat the zinc powders therein, sufficient oxygen cannot be sent into the crucible, resulting in the fact that zinc oxide whiskers of huge crystals are generated 80 wt % to the total weight of the generated substance, 87% of which are in a specific shape. Moreover, when a crucible made of corrosion-resistant stainless steel plate having 0 numerical aperture is used, zinc oxide whiskers are obtained 67 wt % to the total weight of the generated substance, 75% of which is in a specific shape. On the contrary, when the crucible of the present invention having a high numerical aperture is employed, zinc oxide whiskers are obtained 85 wt % or more, and the ratio of the whiskers formed in a specific shape is 95% or more.

When 100 g zinc powders are heated at 950° C. with the air supplied from outside by 3 g/min., it takes 60 minutes by the alumina crucible to obtain zinc oxide whiskers, 35 minutes by the corrosion-resistant stainless steel crucible of 0 numerical aperture, and 25-20 minutes by the crucible of the present invention having 20-60% numerical aperture. Accordingly, the present invention improves productivity of zinc oxide whiskers remarkably in terms of an industrial scale.

The material for members of a high numerical aperture and bottom of the crucible is best if it is corrosion-resistant stainless steel not containing nickel with a small thermal capacity. In comparing the practical durability, the corrosion-resistant stainless steel plate not containing nickel shows durability 5-6 times the one containing nickel. Therefore, the corrosion-resistant stainless steel plate composed of chromium 18-20%, aluminum 2-3% and iron the rest as indicated in Embodiment 22 is most useful.

As another advantage of the present invention, as is explained with reference to Embodiments 23 and 24, a novel crucible is provided, whereby oxygen can be smoothly fed into the crucible which is the cente of solid-liquid-gas phase reaction field in correspondence to the secular change in concentration of zinc steam, so that 3-30 tm zinc oxide whiskers and 30-250 tm zinc oxide whiskers are selectively formed above and below a partition plate, respectively.

A necessary amount of oxygen cannot be supplied by a general crucible. Therefore, zinc oxide whiskers of huge crystals are generated only 80 wt % to the total weight of the generated substance, and 87% of which are in a specific shape.

After many experiments are conducted to see whether the acicular parts of zinc oxide whiskers can be selectively formed in size by the partition plate with using a corrosion-resistant stainless steel crucible of 0 numerical aperture, 20% or lower numerical aperture and 60% or higher numerical aperture, it is confirmed that the crucible of the present invention is most effective from the viewpoints of the generating yield of zinc oxide whiskers, and the ratio of zinc oxide whiskers in a specific shape.

Furthermore, when 100 g zinc powders are heated at 950° C. with the air supplied from outside by 3 g/min., an alumina crucible takes 60 minutes to generate zinc oxide whiskers, a corrosion-resistant stainless steel plate crucible of 0 numerical aperture with the partition plate takes 45 minutes, whereas one without the partition plate takes 35 minutes. The crucible having 20-60% numerical aperture with the partition plate takes 25-20 minutes. The crucible of 20-60% numerical aperture with the partition plate as in Embodiment 23 takes 27-22 minutes, whereby zinc oxide whiskers of a specific shape are selectively obtained in size of the acicular parts thereof. Furthermore, the crucible employed in Embodiment 24 is further effective to shorten the time, namely, it takes only 26-21 minutes to form zinc oxide whiskers in a specific shape and selectively in size. The corrosion-resistant stainless steel plate with a small thermal capacity not containing nickel is preferable for the material of the members and bottom of the crucible, showing durability in practical use 5-6 times the stainless steel containing nickel. Accordingly, the stainless steel plate composed of chromium 18-20%, aluminum 2-3% and iron the rest which is used in Embodiments 23 and 24 is most useful.

As is clear from the result in Embodiments 25-32, an advantageous effect of the present invention is that the distribution of shape (size) and yield of whiskers can be changed in accordance with the oxygen amount remaining in the atmosphere, that is, the oxygen amount which is calculated by subtracting the oxygen amount consumed or being consumed by the reaction from the oxygen amount before the reaction, even though the other conditions for reaction are kept the same. Whiskers are dispersed in various kinds of matrix materials (e.g., ceramics, plastics, rubbers, glasses and metals, etc.), in other words, whiskers are used as an additive of a composite material in many cases. Therefore, a desirable shape of whiskers is naturally determined in accordance with the kind of the composite material to which the whiskers are added. If the distribution of size of whiskers is freely selected, it works a fairly important effect in manufacture of whiskers. According to the present invention, the oxygen concentration in the atmosphere before reaction or in the circulating atmospheric gas can be determined based on the supply amount of zinc powders so that the concentration of remaining oxygen in the atmosphere during reaction is not higher than 10%, preferably 3-5% or lower, whereby whiskers of a larger size (60-400 tm, the center of distribution is 50 tm or larger) are generated. On the contrary, in order to obtain whiskers of a smaller size (1-100 tm, the center of distribution is 50 tm or smaller), the oxygen concentration in the atmosphere before reaction or in the circulating atmospheric gas is determined so that the concentration of remaining oxygen during reaction is 20-60%, preferably 30-50%. Meanwhile, when the closed-type reaction system as in Embodiment 1 is used for reaction, the excessive ratio of oxygen to the amount of oxygen necessary for changing the total zinc powders to zinc oxide is calculated from the partial pressure of oxygen in the system before reaction and that after reaction. The result is that the excessive ratio of oxygen should be negative, i.e., oxygen should be supplied insufficiently so as to obtain whiskers of a larger size, whereas the ratio should be positive, specifically, 20-50% excessive to obtain whiskers of a smaller size.

As described above, the manufacturing method of the present invention can control the shape of generated whiskers by controlling the atmosphere in the reaction furnace. More specifically, how the concentration of the atmosphere in the batch (closed) furnace and circulating furnace is determined, and how the concentration is changed with time are concretely described with reference to the Embodiments.

According to one method of the present invention, the reaction furnace is formed of porous walls with gas permeability, which is concretely explained in Embodiments 28 and 30. It is a natural practice that a closed furnace or a circulating furnace manually controlled is employed so as to avoid a disordered change of reaction components (oxygen) from outside the reaction system during the progress of reaction, for easy control of reaction conditions. However, in the structure of the present invention, the furnace equipped with gas permeable walls is placed in the air or composed atmosphere, so that necessary oxygen is automatically introduced into the furnace from outside to complete the reaction. This is based on the idea that formation of zinc oxide whiskers according to the present invention is a result of oxidization reaction, and as disclosed in Embodiment 25, the oxygen in the atmosphere in the furnace before reaction is gradually consumed along with the progress of reaction, whereby the pressure in the furnace is consequently reduced to make a pressure difference inside and outside the furnace which is compensated by introducing fresh air (containing oxygen) through the furnace walls. If the concentration of oxygen in the atmosphere outside the furnace is set to match with the supply amount of zinc powders and also the reacting speed of oxidization (depending on the temperature of the furnace), the yield and distribution of shape of whiskers can be adjusted. Therefore, even when the reaction is proceeded at so high speeds that a manual control of the atmosphere cannot follow, the method of the present invention makes it possible to easily control the atmosphere in a simple structure automatically at a desired time and by a desired amount.

Some most typical examples are described in the foregoing Embodiments as to the control of the atmosphere. Therefore, the controlling method of atmosphere and construction or material of the furnace walls may be any so long as the oxygen amount in the atmosphere is satisfied.

As is made clear from Embodiments 33-41, because the reaction atmosphere mainly composed of oxygen and nitrogen is added with at least either one of carbon dioxide and steam, the distribution of shape and that of size of generated zinc oxide whiskers can be narrowed. The whiskers are used in many cases as a composite material dispersed or scattered in various kinds of matrix materials (e.g., ceramics, plastics, glasses, metals and rubbers, etc.), and therefore a desired size of whiskers is naturally determined for respective matrix materials. From this viewpoint, the distribution of size of whiskers is an important factor in manufacture thereof, and it has long been desired to control the size distribution freely. The present invention makes it possible to manufacture whiskers of a uniform size in a specific shape by adding carbon dioxide or steam to the atmosphere containing oxygen, without using a particular furnace or a complicated method. More specifically, according to Embodiments 33-34, when carbon dioxide is added 5-8% or more and 25% or less in the atmosphere, the width of the distribution of size of generated whiskers (half-value width) is 10-20 tm. On the other hand, without the carbon dioxide added, the half-value width is 50-100 tm. Moreover, if the mixing ratio of carbon dioxide is increased, the crystals in a specific shape can be smaller in size. In this case, however, if carbon dioxide is mixed 50% or more, zinc oxide in a specific shape is generated considerably little. According to Embodiments 35-36, when steam is mixed 10-20%, the effect is a little smaller as compared with the case when carbon dioxide is mixed, but the half-width value of generated whiskers is approximately 2 tm. Therefore, the size of generated whiskers is not so greatly different from the case where carbon dioxide is mixed. In Embodiments 37-38, so long as the mixing ratio of carbon dioxide and steam into the atmosphere is within the range confirmed in Embodiments 33-36, the result sees no great difference, and accordingly it is so understood that carbon dioxide and steam influence the shape of zinc oxide independently, not interfering each other. However, if carbon dioxide or steam is mixed beyond the range, needless to say, the influence works on the shape of zinc oxide. It is clear from Embodiments 39-40 that the present invention is effective not only when the furnace is of an experimental size, but in a practical scale, particularly effective to form whiskers of a uniform shape with high yield. Meanwhile, according to Embodiments 37-38, the atmosphere is composed of oxygen, carbon dioxide, steam and nitrogen, which is obtained, for example, by a burning gas when hydrocarbon fuel is completely burnt. It is easy to change the amount of oxygen remaining in the burning gas (concentration of oxygen) by the ratio of the amount of the air used for burning and the amount of fuel, and therefore the composition of atmosphere components used in Embodiments 37-38 can be easily fabricated by the burning gas. Propane is used as the fuel in Embodiment 41, so that the atmospheric gas of almost the same composition as in Embodiments 37-38 is fabricated by adjusting the burning air amount. The result is approximately identical to that in Embodiments 37-38. Accordingly, it is made clear that the effect of the present invention is achieved by the atmosphere composed of at least either one of carbon dioxide and steam, and oxygen.

In addition to the above-described advantages of the present invention, i.e., zinc oxide whiskers can be manufactured in a specific shape, the whiskers can be manufactured at reduced cost. A large-scale manufacturing apparatus requires a large reaction furnace. Therefore, if the furnace should be heated to a high temperature as for formation of whiskers, it costs a large sum of expenses so as to operate the apparatus. Moreover, a large amount of gas is necessary to compose the atmospheric gas for reaction at an immense expense. Consequently, generated whiskers become an expensive product. On the contrary, the present invention employs a gas furnace for reaction, with utilizing a part of the burning gas as an atmospheric gas for reaction. Therefore, the present invention is remarkably effective and useful for industrial purpose.

Although the foregoing Embodiments depict the most typical examples of the method of the present invention, the present invention is not restricted to the Embodiments as to the controlling method of atmosphere, composing method of composition of atmosphere and kinds of fuels for obtaining a burning gas. So long as the oxygen amount and steam amount or carbon dioxide amount in the atmosphere are satisfied, the present invention is fulfilled.

TABLE 1

| | Container | Grinding/ maturing of powders | Size of zinc oxide whisker* | |
|---|---|---|---|---|
| | | | Length ($\mu$m) | Width ($\mu$m) |
| 1 | Porous alumina porcelain | No | 98 | 7.8 |
| 2 | Porous alumina porcelain | Yes | 82 | 5.2 |

TABLE 1-continued

| | Container | Grinding/ maturing of powders | Size of zinc oxide whisker* Length (μm) | Width (μm) |
|---|---|---|---|---|
| 3 | Silicon carbide | No | 84 | 3.9 |
| 4 | Silicon carbide | Yes | 94 | 2.8 |
| 5 | Silicon carbide | No | 16 | 1.8 |
| 6 | Silicon carbide | Yes | 17 | 2.0 |

N.B.) In the column of the size of whisker marked *, the length indicates a length from an acicular part of a whisker in a specific shape from its base to a tip, and the width indicates a diameter of the base of the acicular part, which are representative values.

TABLE 2

| Embodiment | Ref. Fig. | State at oxidization | Particle size (μm) |
|---|---|---|---|
| 7 | 8 | liquid | 60–200 |
| 8 | 9 | liquid | 60–250 |
| 9 | 10 | solid | 50–300 |
| 10 | 11 | solid | 60–350 |
| 11 | 12 | gas, liquid | 1–30 |
| 12 | 13 | gas, liquid | 1–30 |

| Embodiment | Shape (perfectness) | Size of zinc oxide whisker* Length (μm) | Width (μm) |
|---|---|---|---|
| 7 | ○ | 122 | 5.4 |
| 8 | ⊚ | 113 | 5.3 |
| 9 | ○ | 80 | 5.4 |
| 10 | ⊚ | 136 | 6.4 |
| 11 | ⊚ | 54 | 2.7 |
| 12 | ⊚ | 54 | 4.1 |

N.B.) In the column of the size of whisker marked *, the length indicates a length from an acicular part of a whisker in a specific shape from its base to a tip, and the width indicates a diameter of the base of the acicular part, which are representative values.

TABLE 3

| No. | Ref. Fig. | Generating of huge whiskers | Ceramic powders mixed at baking |
|---|---|---|---|
| Emb. 13 | 14 | ○ | synthetic zeolite |
| Emb. 14 | 15 | ○ | synthetic zeolite |
| Emb. 15 | 16 | ○ | active alumina |
| Comp. 2 | 17 | Δ | not mixing |
| Comp. 3 | 18 | Δ | not mixing |
| Comp. 4 | 19 | Δ | not mixing |

| No. | Size of whisker* Length (μm) | Width (μm) |
|---|---|---|
| Emb. 13 | 106 | 5.6 |
| Emb. 14 | 111 | 5.4 |
| Emb. 15 | 50 | 3.1 |
| Comp. 2 | 157 | 2.7 |
| Comp. 3 | 150 | 3.5 |
| Comp. 4 | 112 | 3.2 |

N.B.) In the column of the size of whisker marked *, the length indicates a length from an acicular part of a whisker in a specific shape from its base to a tip, and the width indicates a diameter of the base of the acicular part, which are representative values.

TABLE 4

| Emb. | Method for flame-spray | Crush/ maturing | Size of whisker* Length (μm) | Width (μm) |
|---|---|---|---|---|
| 16 | wire melting by gas | not done | 181 | 8.3 |
| 17 | the same | done | 128 | 5.6 |
| 18 | powder melting by gas | not done | 88 | 4.5 |
| 19 | the same | done | 66 | 3.9 |
| 20 | plasma jet | not done | 108 | 5.6 |
| 21 | the same | done | 92 | 2.8 |

N.B.) In the column of the size of whisker marked *, the length indicates a length from an acicular part of a whisker in a specific shape from its base to a tip, and the width indicates a diameter of the base of the acicular part, which are representative values.

TABLE 5

| Types of crucible | Ratio of zinc oxide whiskers per total weight of generated substance (%) | Ratio of zinc oxide whiskers in specifie shape (%) |
|---|---|---|
| High numerical aperture 20–60% crucible | 85 | 95 |
| High numerical aperture ≦20% crucible | 68–82 | 75–88 |
| High numerical aperture ≧60% crucible | 85 | 95 |
| Num. Ap. 0% anti-corrosion stainless steel plate crucible | 67 | 75 |
| Alumina crucible | 80 | 87 |

| Types of crucible | Accommodating ratio in crucible (%) | Time for completion of heating (Min.) |
|---|---|---|
| High numerical aperture 20–60% crucible | 84 | 25–20 |
| High numerical aperture ≦20% crucible | 85 | 35–25 |
| High numerical aperture ≧60% crucible | 76 | 20 |
| Num. Ap. 0% anti-corrosion stainless steel plate crucible | 90 | 35 |
| Alumina crucible | 90 | 60 |

TABLE 6

| Type of crucible | Selective formation of acicular part of whisker in length (μm) | Length of needle-shaped crystal of whisker (μm) | Generating ratio of whisker (%) | Ratio of specific shape (%) | Accommodating ratio in crucible (%) | Time for heating (min.) |
|---|---|---|---|---|---|---|
| Embodiment 23 | possible | 3–30 | 100 | 95 | 87 | 27–22 |
| | | 30–250 | 80 | 85 | 87 | 26–21 |
| Embodiment 24 | possible | 3–30 | 100 | 95 | | |
| | | 30–250 | 85 | 94 | | |
| Numerical aperture 20–60% crucible (without partition plate) | impossible | 3–250 | 85 | 95 | 84 | 25–20 |
| Num. Ap. ≦20% (without partition plate) | impossible | 3–250 | 82 | 88 | 85 | 35–25 |
| Num. Ap. ≦20% | possible | 3–30 | 100 | 60 | 85 | 40–27 |

TABLE 6-continued

| Type of crucible | Selective formation of acicular part of whisker in length (μm) | Length of needle-shaped crystal of whisker (μm) | Generating ratio of whisker (%) | Ratio of specific shape (%) | Accommodating ratio in crucible (%) | Time for heating (min.) |
|---|---|---|---|---|---|---|
| (with partition plate) | | 30–250 | 70 | 48 | | |
| Num. Ap. ≧60% (without partition plate) | impossible | 3–250 | 85 | 95 | 76 | 20 |
| Num. Ap. ≧60% (with partition) plate) | possible | 3–30<br>30–250 | 100<br>80 | 95<br>95 | 45 | 25 |
| Steel plate (Num. Ap. 0) (without partition plate) | impossible | 3–250 | 67 | 75 | 90 | 35 |
| Steel plate (Num. Ap. 0) (with partition plate) | possible | 3–30<br>30–250 | 100<br>60 | 55<br>40 | 90 | 45 |

TABLE 7

| No. | Zinc metal | Oxygen concentration in atmosphere (%) Before reaction | Oxygen concentration in atmosphere (%) After reaction | Generating ratio of specific shape crystals (%) |
|---|---|---|---|---|
| 1 | 2.0 | 5 | 0 | 15 |
| 2 | 2.0 | 10 | 0 | 53 |
| 3 | 2.0 | 15 | 0 | 75 |
| 4 | 2.0 | 20 | 0 | 80 |
| 5 | 2.0 | 25 | 1 | 82 |
| 6 | 2.0 | 30 | 3 | 85 |
| 7 | 2.0 | 35 | 5 | 81 |
| 8 | 2.0 | 40 | 10 | 58 |
| 9 | 2.0 | 50 | 19 | 18 |

| No. | Size of specific shape crystals (μm) distribution width | Size of specific shape crystals (μm) Center thereof |
|---|---|---|
| 1 | 10–150 | 49 |
| 2 | 15–250 | 55 |
| 3 | 15–300 | 68 |
| 4 | 20–300 | 75 |
| 5 | 25–350 | 73 |
| 6 | 15–250 | 65 |
| 7 | 5–200 | 45 |
| 8 | 1–150 | 36 |
| 9 | 0.1–100 | 23 |

TABLE 8

| No. | Zinc metal (g) | Oxygen concentration in atmosphere (%) Before reaction | Oxygen concentration in atmosphere (%) Right after re-circulation | Oxygen concentration in atmosphere (%) During normal circulation |
|---|---|---|---|---|
| 1 | 2 | 15 | 1 | 5 |
| 2 | 2 | 15 | 0 | 5 |
| 3 | 2 | 15 | 0 | 5 |
| 4 | 2 | 15 | 0 | 5 |
| 5 | 2 | 15 | 2 | 30 |
| 6 | 2 | 15 | 0 | 30 |
| 7 | 2 | 15 | 0 | 30 |
| 8 | 2 | 15 | 0 | 30 |
| 9 | 2 | 40 | 8 | 5 |
| 10 | 2 | 40 | 8 | 5 |
| 11 | 2 | 40 | 9 | 5 |
| 12 | 2 | 40 | 8 | 5 |

| No. | Circulation stop period (min) | Generating ratio of specific shape cristal (%) | Size of crystal (μm) Distribution width | Size of crystal (μm) Center |
|---|---|---|---|---|
| 1 | 0.5 | 68 | 5–180 | 25 |
| 2 | 1.0 | 72 | 25–300 | 78 |
| 3 | 1.5 | 70 | 25–350 | 85 |
| 4 | 2.0 | 38 | 3–250 | 65 |
| 5 | 0.5 | 52 | 2–150 | 23 |
| 6 | 1.0 | 63 | 15–250 | 53 |
| 7 | 1.5 | 60 | 15–270 | 60 |
| 8 | 2.0 | 25 | 1–200 | 25 |
| 9 | 0.5 | 13 | 0.1–80 | 35 |
| 10 | 1.0 | 37 | 1–100 | 25 |
| 11 | 1.5 | 20 | 1–150 | 20 |
| 12 | 2.0 | 8 | 5–200 | 15 |

TABLE 9

| No. | Zinc metal (g) | Normal circulation speed (cm/sec) | Stepped circulation Stationary period (min) | Stepped circulation Speed (cm/sec) |
|---|---|---|---|---|
| 1 | 2.0 | 0.06 | — | — |
| 2 | 2.0 | 0.09 | — | — |
| 3 | 2.0 | 0.15 | — | — |
| 4 | 2.0 | 0.20 | — | — |
| 5 | 2.0 | 0.40 | — | — |
| 6 | 2.0 | — | 0.5 | 0.09 |
| 7 | 2.0 | — | 1.0 | 0.09 |
| 8 | 2.0 | — | 1.5 | 0.09 |
| 9 | 2.0 | — | 2.0 | 0.09 |

| No. | Generating ratio of specific shape crystals (%) | Size of crystal (μm) Distribution width | Size of crystal (μm) Center thereof |
|---|---|---|---|
| 1 | 68 | 10–350 | 70 |
| 2 | 67 | 5–300 | 65 |
| 3 | 42 | 1–250 | 50 |
| 4 | 20 | 0.1–100 | 15 |
| 5 | 5 | 0.1–50 | 10 |
| 6 | 70 | 1–170 | 25 |
| 7 | 72 | 10–250 | 30 |
| 8 | 60 | 15–300 | 50 |
| 9 | 31 | 23–300 | 55 |

TABLE 10

| No. | Zinc metal (g) | Oxygen concentration in atmosphere outside (%) | Generating ratio of specific shape crystals (%) |
|---|---|---|---|
| 1 | 2.0 | 3 | 30 |
| 2 | 2.0 | 10 | 58 |
| 3 | 2.0 | 15 | 60 |
| 4 | 2.0 | 20 | 68 |
| 5 | 2.0 | 30 | 45 |
| 6 | 2.0 | 40 | 8 |
| 7 | 2.0 | 60 | 6 |

| No. | Size of specific shape crystals (μm) Distribution width | Size of specific shape crystals (μm) Center thereof |
|---|---|---|
| 1 | 30–450 | 70 |
| 2 | 10–300 | 61 |
| 3 | 5–250 | 45 |
| 4 | 5–250 | 40 |
| 5 | 1–200 | 25 |
| 6 | 0.1–150 | 15 |

TABLE 10-continued

| | | |
|---|---|---|
| 7 | 0.1-100 | 10 |

TABLE 11

| No. | Zinc metal weight per gas volume (g/cc) | Generating ratio of specific shape crystals (%) | Size of crystal (μm) Distribution width | Center |
|---|---|---|---|---|
| 1 | 9.1 × 10⁻³ | 50 | 15-250 | 51 |
| 2 | 6.9 × 10⁻³ | 72 | 25-400 | 65 |
| 3 | 4.6 × 10⁻³ | 88 | 15-350 | 61 |
| 4 | 2.2 × 10⁻³ | 82 | 10-250 | 50 |
| 5 | 1.4 × 10⁻³ | 30 | 1-150 | 35 |

TABLE 12

| No. | Zinc metal (g) | Atmosphere in furnace Before reaction Oxygen concentration (%) | Carbon dioxide concentration (%) | After reaction Oxygen concentration (%) |
|---|---|---|---|---|
| 1 | 2.0 | 15 | 0 | 0 |
| 2 | 2.0 | 15 | 5 | 0 |
| 3 | 2.0 | 15 | 15 | 0 |
| 4 | 2.0 | 15 | 25 | 1 |
| 5 | 2.0 | 15 | 40 | 5 |
| 6 | 2.0 | 25 | 0 | 2 |
| 7 | 2.0 | 25 | 45 | 3 |
| 8 | 2.0 | 25 | 65 | 13 |

| No. | Generating ratio of zinc oxyde in specific shape crystal (%) | Shape distribution Size (μm) | Center (μm) | Half value width (μm) |
|---|---|---|---|---|
| 1 | 75 | 15-300 | 65 | 78 |
| 2 | 68 | 20-110 | 45 | 20 |
| 3 | 57 | 25-95 | 42 | 15 |
| 4 | 43 | 20-80 | 38 | 15 |
| 5 | 15 | 10-50 | 32 | 10 |
| 6 | 83 | 20-350 | 70 | 100 |
| 7 | 63 | 10-95 | 40 | 16 |
| 8 | 5 | 5-43 | 31 | 12 |

TABLE 13

| No. | Zinc metal (g) | Circulating atmosphere in furnace Oxygen concentration (%) | Carbon dioxide concentration (%) | Speed (cm/sec) |
|---|---|---|---|---|
| 1 | 2.0 | 5 | 8 | 0.06 |
| 2 | 2.0 | 5 | 8 | 0.09 |
| 3 | 2.0 | 5 | 8 | 0.15 |
| 4 | 2.0 | 5 | 8 | 0.20 |
| 5 | 2.0 | 5 | 8 | 0.40 |
| 6 | 2.0 | 5 | 0 | 0.09 |

| No. | Generating ratio of specific shape crystals (%) | Size (μm) | Center (μm) | Half value width (μm) |
|---|---|---|---|---|
| 1 | 62 | 1-50 | 30 | 15 |
| 2 | 58 | 5-45 | 25 | 15 |
| 3 | 32 | 1-40 | 20 | 10 |
| 4 | 15 | 1-35 | 15 | 10 |
| 5 | 10 | 1-20 | 10 | 8 |
| 6 | 65 | 5-300 | 65 | 110 |

TABLE 14

| No. | Zinc metal (g) | Atmosphere in furnace Before reaction Oxygen concentration (%) | Steam concentration (%) | After reaction Oxygen concentration (%) |
|---|---|---|---|---|
| 1 | 2.0 | 15 | 0 | 0 |
| 2 | 2.0 | 15 | 5 | 0 |
| 3 | 2.0 | 15 | 15 | 0 |
| 4 | 2.0 | 15 | 25 | 0 |
| 5 | 2.0 | 15 | 40 | 5 |
| 6 | 2.0 | 25 | 0 | 2 |
| 7 | 2.0 | 25 | 45 | 3 |
| 8 | 2.0 | 25 | 65 | 10 |

| No. | Generating ratio of specific shape crystals (%) | Shape distribution Size contribution (μm) | Center (μm) | Half value width (μm) |
|---|---|---|---|---|
| 1 | 76 | 15-300 | 65 | 75 |
| 2 | 70 | 25-250 | 55 | 30 |
| 3 | 65 | 20-200 | 50 | 23 |
| 4 | 58 | 15-150 | 45 | 20 |
| 5 | 18 | 10-100 | 40 | 17 |
| 6 | 82 | 20-350 | 70 | 100 |
| 7 | 72 | 30-240 | 55 | 35 |
| 8 | 10 | 25-150 | 45 | 25 |

TABLE 15

| No. | Zinc metal (g) | Circulating atmosphere in furnace Oxygen concentration (%) | Steam concentration (%) | Speed (cm/sec) |
|---|---|---|---|---|
| 1 | 2.0 | 5 | 10 | 0.06 |
| 2 | 2.0 | 5 | 10 | 0.09 |
| 3 | 2.0 | 5 | 10 | 0.15 |
| 4 | 2.0 | 5 | 10 | 0.20 |
| 5 | 2.0 | 5 | 10 | 0.40 |
| 6 | 2.0 | 5 | 0 | 0.09 |

| No. | Generating ratio of specific shape crystals (%) | Shape distribution Size (μm) | Center (μm) | Half value width (μm) |
|---|---|---|---|---|
| 1 | 60 | 20-250 | 60 | 70 |
| 2 | 55 | 20-200 | 55 | 25 |
| 3 | 48 | 15-150 | 48 | 23 |
| 4 | 30 | 15-150 | 45 | 23 |
| 5 | 10 | 10-140 | 40 | 18 |
| 6 | 65 | 5-300 | 65 | 110 |

TABLE 16

| No. | Zinc metal (g) | Atmosphere in furnace | | | | Generating ratio of specific shape crystals (%) | Shape contribution | | |
|---|---|---|---|---|---|---|---|---|---|
| | | Before reaction | | After reaction | | | Size contribution (μm) | Center (μm) | Half value width (μm) |
| | | O2 concentration (%) | CO2 concentration (%) | H2O concentration (%) | O2 concentration (%) | | | | |
| 1 | 2.0 | 15 | 0 | 0 | 0 | 75 | 15-300 | 65 | 78 |
| 2 | 2.0 | 15 | 15 | 15 | 0 | 55 | 20-85 | 38 | 15 |
| 3 | 2.0 | 15 | 15 | 40 | 0 | 20 | 13-70 | 21 | 10 |
| 4 | 2.0 | 15 | 25 | 15 | 0 | 40 | 15-65 | 20 | 10 |
| 5 | 2.0 | 15 | 25 | 40 | 2 | 15 | 10-55 | 20 | 8 |
| 6 | 2.0 | 15 | 40 | 15 | 3 | 13 | 8-45 | 15 | 10 |
| 7 | 2.0 | 15 | 40 | 40 | 6 | 8 | 8-40 | 15 | 8 |
| 8 | 2.0 | 25 | 40 | 40 | 12 | 18 | 5-35 | 13 | 8 |

TABLE 17

| No. | Zinc metal (g) | Atmosphere in furnace | | | | Generating ratio of specific shape crystals (%) | Shape contribution | | |
|---|---|---|---|---|---|---|---|---|---|
| | | O2 concentration (%) | CO2 concentration (%) | H2O concentration (%) | Speed (cm/sec) | | Size contribution (μm) | Center (μm) | Half value width (μm) |
| 1 | 2.0 | 5 | 8 | 10 | 0.06 | 58 | 10–50 | 30 | 14 |
| 2 | 2.0 | 5 | 8 | 10 | 0.09 | 55 | 5–40 | 22 | 13 |
| 3 | 2.0 | 5 | 8 | 10 | 0.15 | 28 | 1–40 | 18 | 8 |
| 4 | 2.0 | 5 | 8 | 10 | 0.20 | 13 | 1–30 | 13 | 8 |
| 5 | 2.0 | 5 | 8 | 10 | 0.40 | 3 | 1–20 | 8 | 6 |
| 6 | 2.0 | 5 | 0 | 0 | 0.09 | 65 | 5–300 | 65 | 110 |

Since whiskers of the present invention are formed of single crystals in a stereoscopic structure without anisotropy, no anisotropy in mechanical and electric properties is brought about when they are used as a reinforcing material or an electronic material. Moreover, in comparison with conventional zinc oxide of small acicular crystals, the whiskers obtained by the present invention are remarkably huge size. Therefore, the whiskers can be mixed with metals, resins, ceramics, etc., thereby increasing the mechanical strength of the mixture. In addition, the whiskers can be manufactured at low cost as compared with silicon carbide or the like used for the same kind of purpose. Accordingly, the present invention is considerably useful from industrial and economical viewpoints.

What is claimed is:

1. A method for manufacturing zinc oxide whiskers comprising the steps of:
   placing zinc powders, each coated with an oxide film comprising zinc oxide on its surface, onto the bottom inside plane of a container having an opening opened to the outside on its one plane,
   heating, in an atmosphere containing oxygen within said container, said zinc powders to vaporize the zinc of each powder article to exhaust zinc vapor through the oxide film to the outside of the oxide film within the container so that the exhausted zinc vapor is oxidized by the oxygen of the atmosphere in the container at a position adjacent to the surface of the powder to form zinc oxide whiskers upon growing crystals of zinc oxide, and
   heaping up the formed whiskers onto the bottom inside plane of the container.

2. A method for manufacturing zinc oxide whiskers which comprises heating zinc powders coated with a sealing oxide film on the surface thereof in an atmosphere containing oxygen.

3. A method for manufacturing zinc oxide whiskers comprising the steps of:
   grinding zinc powders coated with an oxide film in coexistence with water to mature the powders, thereby forming a sealing coating oxide film on the surface thereof; and
   heating said powders in an atmosphere containing oxygen;
   whereby zinc oxide is generated.

4. A method for manufacturing zinc oxide whiskers comprising the steps of:
   adding ceramic powders to metallic zinc powders or zinc powders coated with an oxide film on the surface thereof; and
   heating said powders in an atmosphere containing oxygen, thereby to form zinc oxide.

5. A method for manufacturing zinc oxide whiskers which comprises heating zinc powders in an atmosphere containing oxygen, said zinc powders being obtained through gas flame-spray.

6. A method for manufacturing zinc oxide whiskers which comprises heating of zinc powders in an atmosphere containing oxygen, said zinc powders being obtained through plasma jet.

7. A method for manufacturing zinc oxide whiskers as claimed in claims 5 or 6, further comprising the steps of:
   grinding said zinc powders obtained through flame-spray, in coexistence with water to mature the powders; and
   drying said powders.

8. A method for manufacturing zinc oxide whiskers comprising the steps of:
   placing zinc powders coated with an oxide film on the bottom surface of a metallic crucible which is a container having one surface opened, and a surface opposite to said opening surface and the other side surfaces made of corrosion-resistant stainless steel plate not containing nickel; and
   heating said powders in an atmosphere containing oxygen, thereby to generate zinc oxide 9. A method for manufacturing zinc oxide whiskers as claimed in claim 8, wherein said bottom surface and other side surfaces of said container are not porous.

10. A method for selectively manufacturing zinc oxide whiskers as claimed in claim 8, wherein the bottom surface of said container is not porous or porous through which zinc powders do not pass, and all the other side surfaces of said container are made of wall members with 20% or higher numerical apertures.

11. A method for selectively manufacturing zinc oxide whiskers comprising the steps of:
    placing zinc powders coated with an oxide film on the bottom surface of a container, said container having one surface opened, said bottom surface opposite to said opening surface being made of a member with 0–3% low numerical aperture, and side surfaces being made of wall members with 20% or higher numerical aperture, wherein a partition plate with the same high numerical aperture as said side surfaces is provided confronting to said bottom surface and separated at least 1.5 mm or more from said bottom surface at a height not higher than said side surfaces; and
    heating said powders in an atmosphere containing oxygen,
    whereby zinc oxide whiskers of a smaller size are generated above said partition plate, while zinc oxide powders of a larger size are generated below said partition plate.

12. A method for manufacturing zinc oxide whiskers as claimed in claim 11, wherein said partition plate is a flat plate.

13. A method for manufacturing zinc oxide whiskers as claimed in claim 11, wherein said partition plate is a corrugated plate confronting to said bottom surface.

14. A method for manufacturing zinc oxide whiskers as claimed in claim 11, wherein said bottom surface made of a member with a low numerical aperture is formed of porcelain, or corrosion-resistant stainless steel plate not containing nickel.

15. A method for manufacturing zinc oxide whiskers as claimed in claim 1, wherein the zinc powders are baked in a furnace having porous walls so that fresh air is introduced into said furnace through said furnace walls subsequent to pressure reduction as a result of oxidation reaction in said furnace.

16. A method for manufacturing zinc oxide whiskers as claimed in claim 1, wherein the zinc powders are baked in a furnace having furnace walls without gas permeability while an atmosphere containing oxygen which is controlled in partial pressure and time is being circulated in the furnace.

17. A method for manufacturing zinc oxide whiskers as claimed in claims 15 or 16, wherein an atmosphere circulating reaction system whereby an adjusted oxygen is supplied from outside is employed so that the concentration of oxygen in an atmosphere during oxidation reaction is made constant.

18. A method for manufacturing zinc oxide whiskers as claimed in claims 15 or 16, wherein an atmosphere batch reaction system whereby the concentration of oxygen before start of oxidization reaction is adjusted is employed, so that the concentration of remaining oxygen after completion of oxidization reaction is made constant.

19. A method for manufacturing zinc oxide whiskers as claimed in claims 15 or 16, wherein an atmosphere step reaction system is employed whereby an atmosphere is controlled so that it is held static until the concentration of remaining oxygen in said atmosphere immediately after the start of oxidization reaction becomes 0%, and thereafter it is circulated.

20. A method for manufacturing zinc oxide whiskers which comprises baking zinc powders for oxidization in an atmosphere containing oxygen, said atmosphere being added with carbon dioxide gas.

21. A method for manufacturing zinc oxide whiskers which comprises baking zinc powders for oxidization in an atmosphere containing oxygen, said atmosphere being added with steam.

* * * * *

UNITED STATES PATENT AND TRADEMARK OFFICE
CERTIFICATE OF CORRECTION

PATENT NO. : 5,158,643

DATED : October 27, 1992

INVENTOR(S) : Minoru Yoshinaka, Eizo Asakura, Motoi Kitano, Jun Yagi, Hideyuki Yoshida, Takashige Sato It is certified that error appears in the above-identified patent and that said Letters Patent is hereby corrected as shown below:

On the title page:
In the heading of the patent, item [22], change the PCT filing date to --Dec. 13, 1989--.

Signed and Sealed this

Seventh Day of December, 1993

Attest:

BRUCE LEHMAN

Attesting Officer

Commissioner of Patents and Trademarks